United States Patent
Kushibe et al.

(10) Patent No.: US 9,012,888 B2
(45) Date of Patent: Apr. 21, 2015

(54) SEMICONDUCTOR LIGHT EMITTING DEVICE, WAFER, METHOD FOR MANUFACTURING SEMICONDUCTOR LIGHT EMITTING DEVICE, AND METHOD FOR MANUFACTURING WAFER

(75) Inventors: Mitsuhiro Kushibe, Tokyo (JP); Yasuo Ohba, Kanagawa-ken (JP); Hiroshi Katsuno, Tokyo (JP); Kei Kaneko, Kanagawa-ken (JP); Shinji Yamada, Tokyo (JP)

(73) Assignee: Kabushiki kaisha Toshiba, Tokyo (JP)

(*) Notice: Subject to any disclaimer, the term of this patent is extended or adjusted under 35 U.S.C. 154(b) by 0 days.

(21) Appl. No.: 13/406,705

(22) Filed: Feb. 28, 2012

(65) Prior Publication Data

US 2013/0069032 A1  Mar. 21, 2013

(30) Foreign Application Priority Data

Sep. 15, 2011 (JP) .................. 2011-202319

(51) Int. Cl.
| | |
|---|---|
| *H01L 33/06* | (2010.01) |
| *H01L 33/32* | (2010.01) |
| *H01L 33/00* | (2010.01) |

(52) U.S. Cl.
CPC ............ *H01L 33/06* (2013.01); *H01L 33/0079* (2013.01); *H01L 33/32* (2013.01)

(58) Field of Classification Search
CPC ........................................................ H01L 33/06
USPC ...................................... 257/14, 15, E33.008
See application file for complete search history.

(56) References Cited

U.S. PATENT DOCUMENTS

| | | | |
|---|---|---|---|
| 7,358,522 B2* | 4/2008 | Yanamoto ...................... 257/14 |
| 8,358,673 B2* | 1/2013 | Bhat et al. .................. 372/45.01 |

(Continued)

FOREIGN PATENT DOCUMENTS

| | | |
|---|---|---|
| JP | 2002-171028 A | 6/2002 |
| JP | 2002-540618 A | 11/2002 |

(Continued)

OTHER PUBLICATIONS

Park et al. "The effect of silicon doping in the selected barrier on the electroluminescence of InGaN/GaN multiquantum well light emitting diode." Appl. Phys. Lett. 90, 031102 (2006).*

(Continued)

*Primary Examiner* — Cheung Lee
*Assistant Examiner* — Stephen Bradley
(74) *Attorney, Agent, or Firm* — Oblon, McClelland, Maier & Neustadt, L.L.P.

(57) ABSTRACT

According to one embodiment, a semiconductor light emitting device includes a first layer of n-type and a second layer of p-type including a nitride semiconductor, a light emitting unit provided between the first and second layers, a first stacked structure provided between the first layer and the light emitting unit, and a second stacked structure provided between the first layer and the first stacked structure. The light emitting unit includes barrier layers and a well layer provided between the barrier layers. The first stacked structure includes third layers including a nitride semiconductor, and fourth layers stacked with the third layers and including GaInN. The fourth layers have a thinner thickness than the well layer. The second stacked structure includes fifth layers including a nitride semiconductor, and sixth layers stacked with the fifth layers and including GaInN. The sixth layers have a thinner thickness than the well layer.

14 Claims, 17 Drawing Sheets

(56) References Cited

U.S. PATENT DOCUMENTS

| | | | |
|---|---|---|---|
| 8,359,673 B2* | 1/2013 | Fukasawa | 2/448 |
| 8,399,948 B2* | 3/2013 | Yoon et al. | 257/449 |
| 8,569,738 B2* | 10/2013 | Kushibe et al. | 257/14 |
| 2007/0063207 A1* | 3/2007 | Tanizawa et al. | 257/94 |
| 2010/0025657 A1* | 2/2010 | Nagahama et al. | 257/13 |
| 2010/0270531 A1* | 10/2010 | Samal | 257/13 |
| 2012/0235116 A1* | 9/2012 | Su et al. | 257/13 |
| 2012/0313077 A1* | 12/2012 | Nakamura et al. | 257/13 |

FOREIGN PATENT DOCUMENTS

| | | |
|---|---|---|
| JP | 2007-305965 A | 11/2007 |
| JP | 2009-38239 A | 2/2009 |
| JP | 2009-246275 A | 10/2009 |
| JP | 2010-205988 | 9/2010 |
| JP | 2011-138971 A | 7/2011 |

OTHER PUBLICATIONS

Tsai et al. "Enhanced Luminescence Efficiency of InGaN/GaN Multiple Quantum Wells by a Strain Relief Layer and Proper Si Doping." Japanese Journal of Applied Physics 49, 2010.*

Schubert et al. "Polarization-matched GaInN/AlGaInN multi-quantum-well light emitting diodes with reduced efficiency droop." Applied Physics Letters 93, 041102 (2008).*

Office Action issued Apr. 2, 2014 in Japanese Patent Application No. 2011-203319 with English language translation.

* cited by examiner

SEMICONDUCTOR LIGHT EMITTING DEVICE, WAFER, METHOD FOR MANUFACTURING SEMICONDUCTOR LIGHT EMITTING DEVICE, AND METHOD FOR MANUFACTURING WAFER

CROSS-REFERENCE TO RELATED APPLICATIONS

This application is based upon and claims the benefit of priority from the prior Japanese Patent Application No. 2011-202319, filed on Sep. 15, 2011; the entire contents of which are incorporated herein by reference.

FIELD

Embodiments described herein relate generally to a semiconductor light emitting device, a wafer, a method for manufacturing the light emitting device, and a method for manufacturing the wafer.

BACKGROUND

Nitride semiconductors are used in various semiconductor devices such as semiconductor light emitting devices and HEMT (high electron mobility transistor) devices. However, the characteristics of such nitride semiconductor devices are restricted by high density threading dislocations due to lattice mismatch with the GaN crystal.

Semiconductor light emitting devices or LED (light emitting diode) devices based on nitride semiconductors are expected as a phosphor-exciting light source for e.g. white LED. However, the problem is that high light emission efficiency, or high optical output, cannot be achieved when the output power is increased.

Various proposals have been made to increase the efficiency of LED and other semiconductor light emitting devices based on nitride semiconductors.

DETAILED DESCRIPTION

Figure 1:
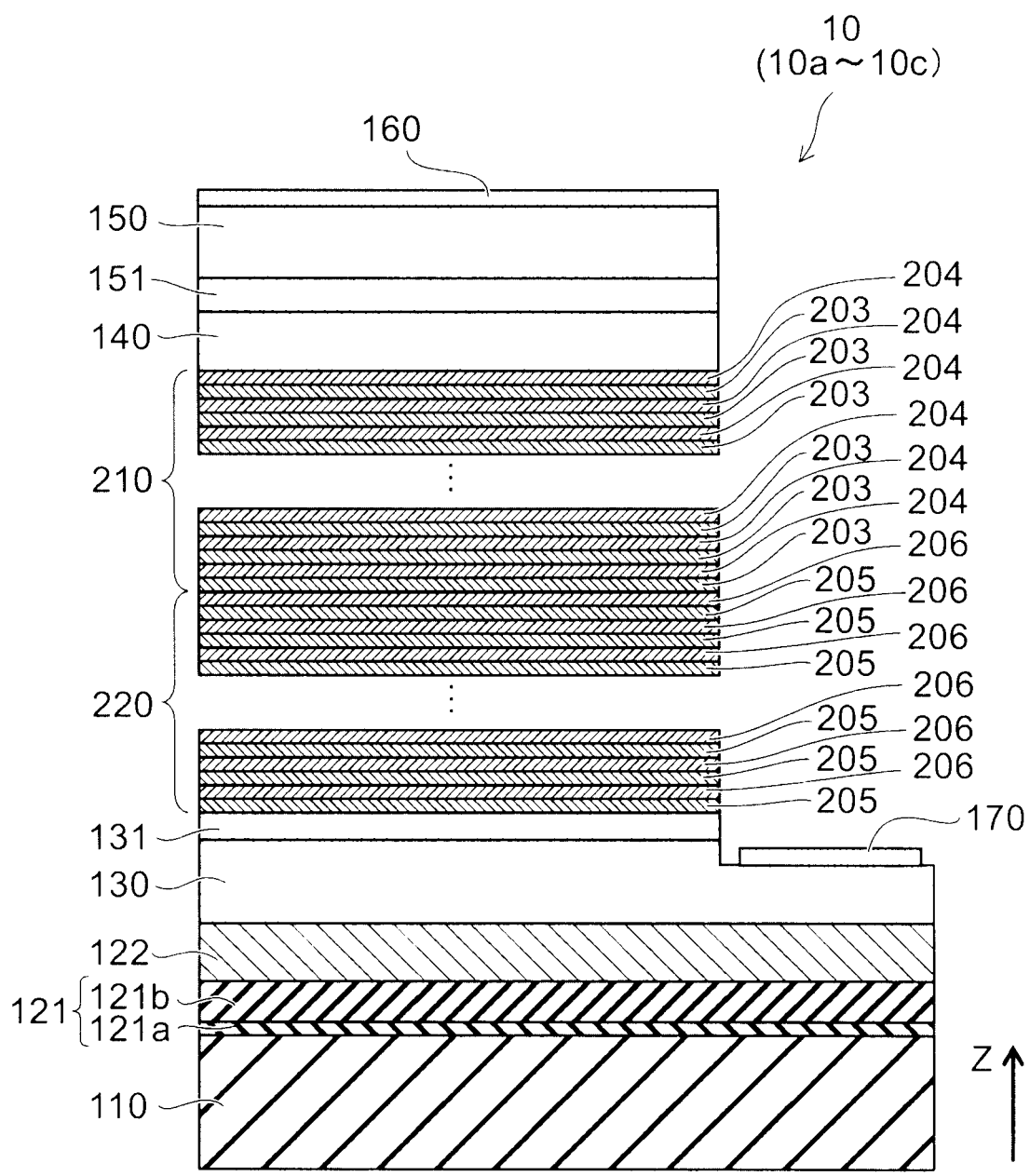
FIG. 1 is a schematic sectional view illustrating a semiconductor light emitting device according to a first embodiment.

According to one embodiment, a semiconductor light emitting device includes a first layer of n-type including a nitride semiconductor, a second layer of p-type including a nitride semiconductor, a light emitting unit provided between the first layer and the second layer, a first stacked structure provided between the first layer and the light emitting unit, and a second stacked structure provided between the first layer and the first stacked structure. The light emitting unit includes a plurality of barrier layers and a well layer provided between the barrier layers. The first stacked structure includes a plurality of third layers including a nitride semiconductor, and a plurality of fourth layers alternately stacked with the third layers, each of the fourth layers having a thickness thinner than a thickness of the well layer, and including GaInN. The second stacked structure includes a plurality of fifth layers having a composition different from a composition of the third layers and including a nitride semiconductor, and a plurality of sixth layers alternately stacked with the fifth layers, each of the sixth layers having a thickness thinner than the thickness of the well layer, and including GaInN.

According to another embodiment, a semiconductor light emitting device includes a first layer of n-type including a nitride semiconductor, a second layer of p-type including a nitride semiconductor, a light emitting unit provided between the first layer and the second layer, and a first stacked structure provided between the first layer and the light emitting unit. The light emitting unit includes a plurality of barrier layers including AlGaInN and a well layer provided between the barrier layers. The first stacked structure includes a plurality of third layers including AlGaInN, and a plurality of fourth layers alternately stacked with the third layers, each of the fourth layers having a thickness thinner than a thickness of the well layer, and including GaInN. Number of the third layers and number of the fourth layers are 10 or more and 30 or less.

According to another embodiment, a wafer includes a first layer of n-type including a nitride semiconductor, a second layer of p-type including a nitride semiconductor, a light emitting unit provided between the first layer and the second layer, and a first stacked structure provided between the first layer, the light emitting unit, and a second stacked structure provided between the first layer and the first stacked structure. The light emitting unit includes a plurality of barrier layers and a well layer provided between the barrier layers. The first stacked structure includes a plurality of third layers including a nitride semiconductor, and a plurality of fourth layers alternately stacked with the third layers, each of the fourth layers having a thickness thinner than a thickness of the well layer, and including GaInN. The second stacked structure includes a plurality of fifth layers having a composition different from a composition of the third layers and including a nitride semiconductor, and a plurality of sixth layers alternately stacked with the fifth layers, each of the sixth layers having a thickness thinner than the thickness of the well layer, and including GaInN.

According to another embodiment, a wafer includes a first layer of n-type including a nitride semiconductor, a second layer of p-type including a nitride semiconductor, a light emitting unit provided between the first layer and the second layer, a first stacked structure provided between the first layer and the light emitting unit. The light emitting unit includes a plurality of barrier layers including AlGaInN and a well layer provided between the barrier layers. The first stacked structure includes a plurality of third layers including AlGaInN, and a plurality of fourth layers alternately stacked with the third layers, each of the fourth layers having a thickness thinner than a thickness of the well layer, and including GaInN. Number of the third layers and number of the fourth layers are 10 or more and 30 or less.

According to another embodiment, a method is disclosed for manufacturing a semiconductor light emitting device. The method can include forming a single crystal buffer layer including $Al_{x3}Ga_{1-x3}N$ ($0.8 \leq x3 \leq 1$) on a substrate having a major surface of c-plane of a sapphire layer or a major surface of silicon. The method can include forming a GaN layer on the single crystal buffer layer. The method can include forming an n-type semiconductor layer including a first layer including at least one of n-type GaN and n-type AlGaN on the GaN layer. The method can include forming a second stacked structure by alternately stacking a plurality of fifth layers including a nitride semiconductor and a plurality of sixth layers including GaInN on the n-type semiconductor layer. The method can include forming a first stacked structure by alternately stacking a plurality of third layers including a nitride semiconductor and a plurality of fourth layers including GaInN on the second stacked structure, the third layers having a composition different from a composition of the fifth layers. The method can include forming a light emitting unit including a barrier layer and a well layer on the first stacked structure. The method can include forming a p-type semiconductor layer including a second layer including p-type AlGaN on the light emitting unit. In addition, the method can include removing the substrate after the forming a p-type semiconductor layer.

According to another embodiment, a method is disclosed for manufacturing a semiconductor light emitting device. The method can include forming an AlN layer on a substrate made of sapphire or Si by metal organic chemical vapor deposition. The method can include forming a GaN layer on the AlN layer by the metal organic chemical vapor deposition. The method can include forming an n-type semiconductor layer including a first layer including at least one of n-type GaN and n-type AlGaN on the GaN layer by the metal organic chemical vapor deposition. The method can include forming a second stacked structure by alternately stacking a plurality of fifth layers including a nitride semiconductor and a plurality of sixth layers including GaInN on the n-type semiconductor layer by the metal organic chemical vapor deposition. The method can include forming a first stacked structure by alternately stacking a plurality of third layers including a nitride semiconductor and a plurality of fourth layers including GaInN on the second stacked structure by the metal organic chemical vapor deposition, the third layer having a composition different from a composition of the fifth layer. The method can include forming a light emitting unit including a barrier layer and a well layer on the first stacked structure by the metal organic chemical vapor deposition. In addition, the method can include forming a p-type semiconductor layer including a second layer including p-type AlGaN on the light emitting unit by the metal organic chemical vapor deposition.

According to another embodiment, a method is disclosed for manufacturing a wafer. The method can include forming an AlN layer on a substrate made of sapphire or Si by metal organic chemical vapor deposition. The method can include forming a GaN layer on the AlN layer by the metal organic chemical vapor deposition. The method can include forming an n-type semiconductor layer including a first layer including at least one of n-type GaN and n-type AlGaN on the GaN layer by the metal organic chemical vapor deposition. The method can include forming a second stacked structure by alternately stacking a plurality of fifth layers including a nitride semiconductor and a plurality of sixth layers including GaInN on the n-type semiconductor layer by the metal organic chemical vapor deposition. The method can include forming a first stacked structure by alternately stacking a plurality of third layers including a nitride semiconductor and a plurality of fourth layers including GaInN on the second stacked structure by the metal organic chemical vapor deposition, the third layer having a composition different from a composition of the fifth layer. The method can include forming a light emitting unit including a barrier layer and a well layer on the first stacked structure by the metal organic chemical vapor deposition. In addition, the method can include forming a p-type semiconductor layer including a second layer including p-type AlGaN on the light emitting unit by the metal organic chemical vapor deposition.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with the same numerals to the earlier figures, and the detailed description thereof is omitted appropriately.

First Embodiment

FIG. 1 is a schematic sectional view illustrating the configuration of a semiconductor light emitting device according to a first embodiment. As shown in FIG. 1, the semiconductor light emitting device 10 according to the embodiment includes a first layer 131 of n-type, a second layer 151 of p-type, a light emitting unit 140, a first stacked structure 210, and a second stacked structure 220.

The first layer 131 includes a nitride semiconductor. The second layer 151 includes a nitride semiconductor. The first layer 131 includes e.g. at least one of n-type GaN and n-type AlGaN. The second layer 151 includes e.g. p-type AlGaN. For instance, the first layer 131 can be an n-type confinement layer containing silicon (Si). The second layer 151 can be a p-type confinement layer including p-type AlGaN containing magnesium (Mg).

Thus, the semiconductor light emitting device 10 includes semiconductor layers including an n-type semiconductor layer, a p-type semiconductor layer, and a light emitting unit 140 provided between the n-type semiconductor layer and the p-type semiconductor layer. These semiconductor layers can be made of e.g. a gallium nitride-based compound semiconductor such as $Al_{\alpha 1}Ga_{1-\alpha 1-\beta 1}In_{\beta 1}N$ ($\alpha 1 \geq 0$, $\beta 1 \geq 0$, $\alpha 1 + \beta 1 \leq 1$). That is, the semiconductor layers in the embodiment can include a nitride semiconductor.

The light emitting unit 140 is provided between the first layer 131 and the second layer 151. Example configurations of the light emitting unit 140 are described later.

The first stacked structure 210 is provided between the first layer 131 and the light emitting unit 140. The first stacked structure 210 includes a plurality of third layers 203 and a plurality of fourth layers 204. The third layer 203 includes a nitride semiconductor. The plurality of fourth layers 204 are alternately stacked with the plurality of third layers 203. The fourth layer 204 includes GaInN.

The second stacked structure 220 is provided between the first layer 131 and the first stacked structure 210. The second stacked structure 220 includes a plurality of fifth layers 205 and a plurality of sixth layers 206. The fifth layer 205 includes a nitride semiconductor having a composition different from the composition of the third layer. The plurality of sixth layers 206 are alternately stacked with the plurality of fifth layers 205. The sixth layer 206 includes GaInN.

Here, the Z-axis is defined as an axis parallel to the direction from the first layer 131 toward the second layer 151. The plurality of third layers 203 and the plurality of fourth layers 204 are alternately stacked along the Z-axis. The plurality of fifth layers 205 and the plurality of sixth layers 206 are alternately stacked along the Z-axis.

As shown in FIG. 1, the semiconductor light emitting device 10 can further include a substrate 110, a first buffer layer 121, a second buffer layer 122, an n-type contact layer 130, a p-type contact layer 150, a p-side electrode 160, and an n-side electrode 170.

The substrate 110 can be e.g. a sapphire substrate with the major surface being a c-plane. Alternatively, the substrate 110 may be a Si substrate. On the substrate 110, a first buffer layer 121 is provided. The first buffer layer 121 can be e.g. an AlN layer.

For instance, the first buffer layer 121 includes a first AlN buffer layer 121a and a second AlN buffer layer 121b. The first AlN buffer layer 121a is formed on the substrate 110. The first AlN buffer layer 121a has high carbon concentration. The second AlN buffer layer 121b is formed on the first AlN buffer layer 121a. The carbon concentration in the first AlN buffer layer 121a is higher than the carbon concentration in the second AlN buffer layer 121b.

On the first buffer layer 121, a second buffer layer 122 is provided. The second buffer layer 122 can be e.g. a non-doped GaN layer. The second buffer layer 122 is e.g. a lattice relaxation layer.

On the second buffer layer 122, an n-type contact layer 130 is provided. The n-type contact layer 130 can be e.g. a Si-doped n-type GaN layer. On the n-type contact layer 130, a first layer 131 is provided. The first layer 131 is e.g. a Si-doped n-type confinement layer. On the first layer 131, a second stacked structure 220 is provided. On the second stacked structure 220, a first stacked structure 210 is provided. On the first stacked structure 210, a light emitting unit 140 is provided. On the light emitting unit 140, a second layer 151 is provided. The second layer 151 is e.g. a Mg-doped p-type confinement layer. On the second layer 151, a p-type contact layer 150 is provided. The p-type contact layer 150 can be e.g. a Mg-doped p-type GaN layer.

The plurality of third layers 203 of the first stacked structure 210 may include AlGaInN. The plurality of fifth layers 205 of the second stacked structure 220 may include GaN.

On the p-type contact layer 150, a p-side electrode 160 is provided. The p-side electrode 160 is made of e.g. a Ni layer. On the n-type contact layer 130, an n-side electrode 170 is provided. The n-side electrode 170 is made of e.g. a stacked film of Al/Au.

By applying voltage between the p-side electrode 160 and the n-side electrode 170, a current is supplied to the light emitting unit 140, and light (emission light) is emitted from the light emitting unit 140.

FIGS. 2A to 2D are schematic sectional views illustrating the configuration of semiconductor light emitting devices according to the first embodiment.

Figure 2A:
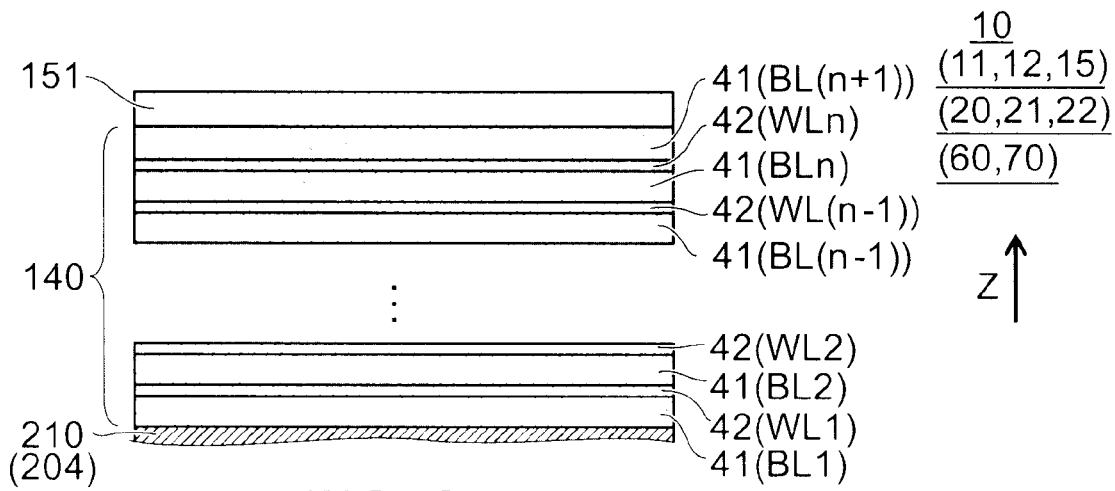
FIGS. 2A to 2D are schematic sectional views illustrating semiconductor light emitting devices according to the first embodiment.
Figure 2B:
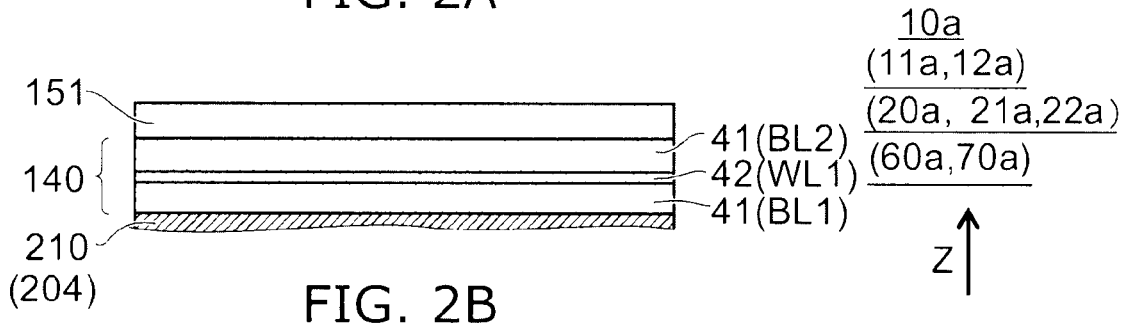
Figure 2C:
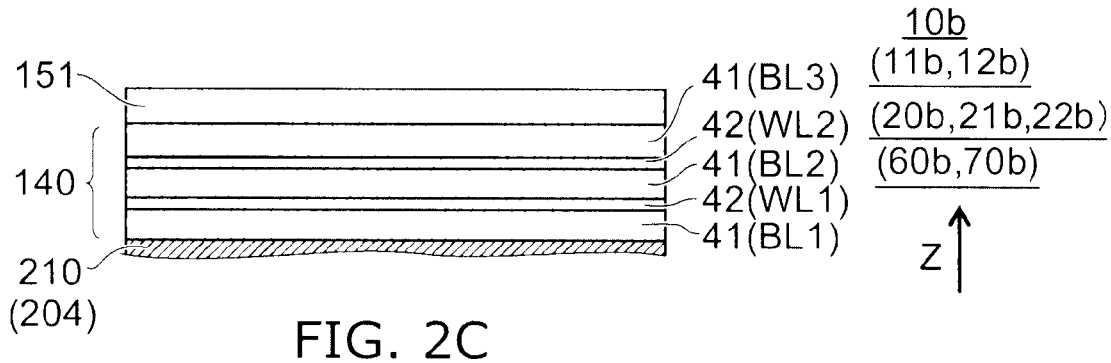
Figure 2D:
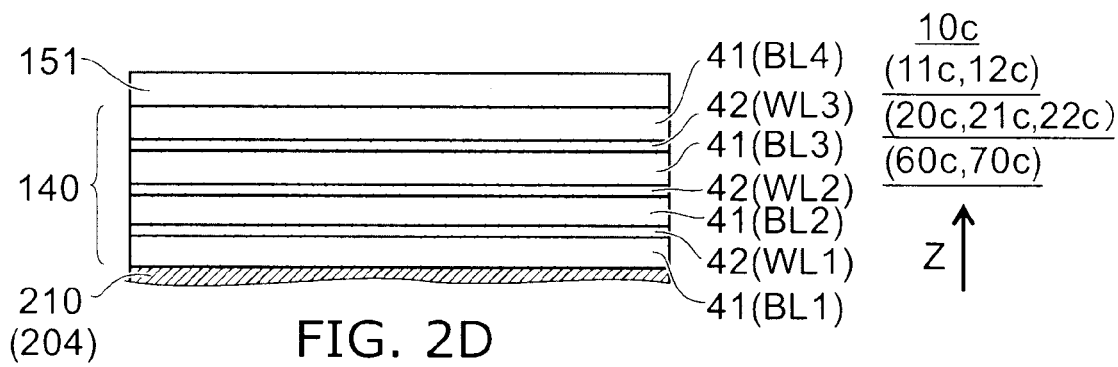

More specifically, FIG. 2A illustrates the configuration of the light emitting unit 140 in the semiconductor light emitting device 10 and semiconductor light emitting devices 11, 12, 15, 20, 21, and 22 and wafers 60 and 70 described later. FIG. 2B illustrates the configuration of the light emitting unit 140 in semiconductor light emitting devices 10a, 11a, 12a, 20a, 21a, and 22a and wafers 60a and 70a. FIG. 2C illustrates the configuration of the light emitting unit 140 in semiconductor light emitting devices 10b, 11b, 12b, 20b, 21b, and 22b and wafers 60b and 70b described later. FIG. 2D illustrates the configuration of the light emitting unit 140 in semiconductor light emitting devices 10c, 11c, 12c, 20c, 21c, and 22c and wafers 60c and 70c described later.

As shown in FIG. 2A, in the semiconductor light emitting device 10, the light emitting unit 140 includes a plurality of barrier layers 41 (e.g., first barrier layer BL1 and second barrier layer BL2) and a well layer 42. The well layer 42 is provided between barrier layers 41.

For instance, the light emitting unit 140 can have a single quantum well (SQW) structure. In this case, the light emitting unit 140 includes two barrier layers 41 and a well layer 42 provided between the barrier layers 41. For instance, the light emitting unit 140 can have a multiple quantum well (MQW) structure. In this case, the light emitting unit 140 includes three or more barrier layers 41 and a well layer 42 provided between each pair of barrier layers 41.

In the example shown in FIG. 2A, the light emitting unit 140 includes n+1 barrier layers 41 and n well layers 42 (n is an integer of 1 or more). The (i+1)-th barrier layer BL(i+1) is placed between the i-th barrier layer BLi and the second layer 151 (i is an integer of 1 or more and n−1 or less). The (i+1)-th well layer WL(i+1) is placed between the i-th well layer WLi and the second layer 151. The first barrier layer BL1 is provided between the first layer 131 and the first well layer WL1 (i.e., between the first stacked structure 210 and the first well layer WL1). The n-th well layer WLn is provided between the n-th barrier layer BLn and the (n+1)-th barrier layer BL(n+1). The (n+1)-th barrier layer BL(n+1) is provided between the n-th well layer WLn and the second layer 151.

As shown in FIG. 2B, in the semiconductor light emitting device 10a according to the embodiment, the light emitting unit 140 includes one well layer 42. As shown in FIG. 2C, in the semiconductor light emitting device 10b according to the embodiment, the light emitting unit 140 includes two well layers 42. As shown in FIG. 2D, in the semiconductor light emitting device 10c according to the embodiment, the light emitting unit 140 includes three well layers 42. Furthermore, the light emitting unit 140 may include four or more well layers 42.

In the case where the light emitting unit 140 has a single quantum well structure, electrons and holes are injected into the same well layer 42. Hence, high efficiency light emission can be achieved. That is, in the case of one well layer 42, unlike the case where a plurality of well layers 42 are provided, nonuniformity in carrier injection efficiency does not occur among the well layers 42.

In the case of two well layers 42, a well layer 42 with high electron injection efficiency is provided on the n-type first layer 131 side, and a well layer 42 with high hole injection efficiency is provided on the p-side second layer 151 side. Hence, the utilization efficiency of carriers is high. In the case of providing many (e.g., four or more) well layers 42, a well layer 42 having low light emission efficiency and high absorber effect may occur. However, in the case of two well layers 42, such a well layer 42 does not occur.

In the case of three well layers 42, of the structures including a plurality of well layers 42, the simplest structure symmetric with respect to electron injection and hole injection can be realized. Hence, the utilization efficiency of carriers is high. In the case of providing many (e.g., four or more) well layers 42, a well layer 42 having low light emission efficiency and high absorber effect may occur. However, in the case of three well layers 42, such a well layer 42 does not occur.

In the case where the light emitting unit 140 has a multiple quantum well structure, the number of well layers 42 contributing to recombination of injected electrons and holes is increased. Hence, high efficiency light emission can be achieved. In particular, even for a large amount of injected carriers (electrons and holes), the increase of carrier density in the well layers 42 is spread and kept low. Thus, the decrease of recombination efficiency is suppressed. Hence, high efficiency light emission can be achieved.

The light emitting unit 140 may have an effective single quantum well structure. The effective single quantum well structure includes e.g. a state in which unevenness of potential exists in the well layer 42. In this case, at least one of an electron and a hole can migrate through the unevenness of potential in the well layer 42. Furthermore, the effective single quantum well structure includes a state in which, for a plurality of well layers 42, the barrier layer 41 between the well layers 42 is thin. In this case, the potential difference of the barrier between the well layers 42 is small. Thus, at least one of an electron and a hole can migrate between the plurality of well layers 42. For instance, in the effective single quantum well structure, leakage of the wave function from the well layer 42 to the region between the well layers 42 is large. Thus, a plurality of well layers 42 are effectively coupled. In the effective single quantum well structure, for instance, the potential of the barrier between the well layers 42 is low. Thus, thermally excited carriers can migrate between a plurality of well layers 42.

The well layer 42 includes a nitride semiconductor including a group III element and a group V element. For instance, the well layer 42 includes a nitride semiconductor including gallium (Ga) and indium (In).

The barrier layer 41 includes a nitride semiconductor including a group III element and a group V element. The bandgap energy of the barrier layer 41 is larger than the bandgap energy of the well layer 42. In the case where the barrier layer 41 includes In, the In concentration among the group III elements of the barrier layer 41 is lower than the In concentration among the group III elements of the well layer 42.

For instance, the first barrier layer BL1 includes e.g. $Al_{x1}Ga_{1-x1-y1}In_{y1}N$ ($0<x1$, $0 \leq y1$, $x1+y1<1$).

For instance, the second barrier layer BL2 includes e.g. $Al_{x2}Ga_{1-x2-y2}In_{y2}N$ ($0<x2$, $0 \leq y2$, $x2+y2<1$). Here, x2 may be equal to or different from x1. Furthermore, y2 may be equal to or different from y1. For instance, $x2<x1$.

For instance, the i-th barrier layer BLi ($1 \leq i \leq n+1$) includes e.g. $Al_{xi}Ga_{1-xi-yi}In_{yi}N$ ($0<xi$, $0 \leq yi$, $\Sigma(xi+yi)<1$). Here, xi may be equal to or different from x1. Furthermore, yi may be equal to or different from y1. For instance, $xi<x1$.

The i-th well layer WLi ($1 \leq i \leq n$) (well layer 42) includes e.g. $Al_{x0}Ga_{1-x0-y0}In_{y0}N$ ($0 \leq x0$, $0<y0$, $x0+y0<1$, $y1<y0$, $y2<y0$). For instance, the first well layer WL1 (well layer 42) includes $Ga_{1-y0}In_{y0}N$ ($0<y0 \leq 1$, $y1<y0$, $y2<y0$).

In any case, the third layer 203 can be provided on the side nearest to the light emitting unit 140 of the first stacked structure 210 so that the third layer 203 functions as a first barrier layer BL1. Alternatively, the light emitting unit 140 side of the first stacked structure 210 can also be regarded as being terminated by the fourth layer 204.

The light (emission light) emitted from the light emitting unit 140 is e.g. near ultraviolet light. The peak wavelength of the emission light is e.g. 380 nm or more and 400 nm or less. However, the embodiment is not limited thereto. The wavelength of the emission light is arbitrary. The peak wavelength of the emission light may be e.g. longer than 400 nm and 500 nm or less. The peak wavelength of the emission light in the light emitting unit 140 can be set to e.g. 470 nm or more.

If the peak wavelength of the emission wavelength in the light emitting unit 140 is 380 nm or more, the influence of absorption by the first stacked structure 210 as well as absorption by GaN with an absorption edge of 365 nm can be reduced. The present inventors have confirmed by PL measurement that if the corresponding emission wavelength of the first stacked structure 210 is 370 nm or more and 380 nm or less, and particularly 370 nm or more and 375 nm or less, then the light emitting unit 140 has high light emission efficiency. Based on this result, it is considered that setting the corresponding emission wavelength of the first stacked structure 210 to the wavelength region of 370 nm or more and 380 nm or less is desirable for device characteristics improvement. Here, the present inventors have confirmed that light emission from the first stacked structure 210 can often be observed by PL measurement of the wafer used for the semiconductor light emitting device of the embodiment. The peak wavelength of this emission spectrum is defined as the corresponding emission wavelength of this semiconductor light emitting device.

In the case where the peak wavelength of the emission wavelength in the light emitting unit 140 is 400 nm or less, the thickness of the well layer 42 is set to 4.5 nm or more and 7 nm or less. Then, for instance, good light emission was achieved. In the case where the peak wavelength of the emission wavelength in the light emitting unit 140 is 395 nm or less, the thickness of the well layer 42 is set to 4.5 nm or more and 7 nm or less. Then, good light emission was achieved. Furthermore, the controllability of emission wavelength and intensity was improved.

In the case where the peak wavelength of the emission wavelength in the light emitting unit 140 is 400 nm or more and 450 nm or less, the thickness of the well layer 42 is set to 3 nm or more and 4.5 nm or less. Then, there were cases where high light emission efficiency was achieved. In the case where the peak wavelength is 420 nm or more and 450 nm or less, by setting the thickness of the well layer 42 to 3.5 nm or more and 4 nm or less, the emission intensity was particularly high, and its controllability was improved.

In a single quantum well structure in which the peak wavelength of the emission wavelength in the light emitting unit 140 is 430 nm or more and 470 nm or less, there were cases where high light emission efficiency was achieved when the thickness of the well layer 42 was 3 nm or more and 3.5 nm or less. In a multiple quantum well structure in which the emission wavelength is 430 nm or more and 470 nm or less, there were cases where high light emission efficiency was achieved when the thickness of the well layer 42 was 2.5 nm or more and 3 nm or less.

The peak wavelength of the emission light in the light emitting unit 140 can be set to e.g. 470 nm or more. Light emission was achieved in the well layer 42 having a thickness of 3.5 nm or less.

In the embodiment, a high quality base crystal can be obtained. Hence, the configuration of the embodiment is applicable to devices including an active layer having a longer wavelength (e.g., a wavelength in the 500-nm band, 600-nm band, 700-nm band, and furthermore, an arbitrary wavelength shorter than 0.75 eV, which is the absorption edge of InN). Furthermore, in addition to the single quantum well structure and multiple quantum well structure, such structures as the DH structure (double heterostructure), quasi-quantum well structure, and quantum dot structure (these structures have a planar light emitting region on average, and can be regarded as well layers) are applicable to the light emitting unit 140.

In the following, as an example in which the number of well layers 42 is arbitrary, the semiconductor light emitting device 10 is described. The following description applies also to the semiconductor light emitting devices 10a-10c.

As shown in FIG. 1, the semiconductor light emitting device 10 includes a first stacked structure 210 and a second stacked structure 220.

The thickness of each of the plurality of fourth layers 204 is thinner than the thickness of the well layer 42 (e.g., first well layer WL1). The thickness of each of the plurality of third layers 203 is thinner than the thickness of each of the plurality of barrier layers 41 (e.g., the thickness of the first barrier layer BL1 and the thickness of the second barrier layer BL2).

The thickness of each of the plurality of sixth layers 206 is thinner than the thickness of the well layer 42 (e.g., first well layer WL1). The thickness of each of the plurality of fifth layers 205 is thinner than the thickness of each of the plurality of barrier layers 41 (e.g., the thickness of the first barrier layer BL1 and the thickness of the second barrier layer BL2).

The first stacked structure 210 has e.g. a superlattice structure. The second stacked structure 220 also has e.g. a superlattice structure. As described above, the fifth layer 205 includes a nitride semiconductor having a composition different from the composition of the third layer. Thus, the semiconductor light emitting device 10 includes two kinds of superlattices.

For instance, the plurality of third layers 203 include one of AlGaInN and GaN, and the plurality of fifth layers 205 include the other of AlGaInN and GaN. For instance, the third layer 203 includes AlGaInN, and the fifth layer 205 includes GaN. Alternatively, the third layer 203 includes GaN, and the fifth layer 205 includes AlGaInN. In the following, the case where the third layer 203 includes AlGaInN and the fifth layer 205 includes GaN is described.

For instance, the first stacked structure 210 is a superlattice including third layers of AlGaInN and fourth layers of GaInN. The second stacked structure 220 is a superlattice including fifth layers of GaN and sixth layers of GaInN. Thus, in the semiconductor light emitting device 10 according to the embodiment, the efficiency is increased by providing two different kinds of stacked structures.

In the following, example characteristics of the semiconductor light emitting device 10 are described. The present inventors actually fabricated the semiconductor light emitting device 10 and evaluated its characteristics. In the following, a method for fabricating the semiconductor light emitting device 10 is described. The following method corresponds to an example of the method for fabricating the semiconductor light emitting device 10 according to the embodiment.

First, by using the metal organic chemical vapor deposition method, on a substrate 110 with the surface made of a sapphire c-plane, an AlN film (a thickness of approximately 2 μm) is formed as a first buffer layer 121. Specifically, a first AlN buffer layer 121a of high carbon concentration is formed. Furthermore, on the first AlN buffer layer 121a, a second AlN buffer layer 121b of high purity is formed. The carbon concentration in the first AlN buffer layer 121a is e.g. $3 \times 10^{18}$ cm$^{-3}$ or more and $5 \times 10^{20}$ cm$^{-3}$ or less. The thickness of the first AlN buffer layer 121a is e.g. 3 nm or more and 20 nm or less. The carbon concentration in the second AlN buffer layer 121b is e.g. $1 \times 10^{16}$ cm$^{-3}$ or more and $3 \times 10^{18}$ cm$^{-3}$ or less. The thickness of the second AlN buffer layer 121b is e.g. approximately 2 μm.

Then, on the first buffer layer 121, a non-doped GaN film (a thickness of 2 μm) is formed as a second buffer layer 122 (lattice relaxation layer).

Then, a Si-doped n-type GaN film is formed as an n-type contact layer 130. The Si concentration in the Si-doped n-type GaN film is e.g. $0.2 \times 10^{19}$ cm$^{-3}$ or more and $2 \times 10^{19}$ cm$^{-3}$ or less. The thickness of the Si-doped n-type GaN film is e.g. 3 μm or more and 10 μm or less, and more preferably e.g. 6 μm. Furthermore, a Si-doped n-type GaN layer is formed as an n-type confinement layer (first layer 131). The Si-doped n-type GaN layer has a Si concentration of e.g. $0.2 \times 10^{18}$ cm$^{-3}$ or more and $9 \times 10^{18}$ cm$^{-3}$ or less, and a thickness of 0.2 μm or more and 1.5 μm or less.

On the second buffer layer 122, a second stacked structure 220 is formed. For instance, GaN layers constituting fifth layers 205 and GaInN layers (e.g., $Ga_{0.93}In_{0.07}N$ layers) constituting sixth layers 206 are alternately stacked. In this example, the fifth layer 205 is doped with Si at e.g. approximately $1.2 \times 10^{18}$ cm$^{-3}$. The thickness of each fifth layer 205 is e.g. 2.5 nm. The thickness of each sixth layer 206 is e.g. 1 nm. In this example, the number of pairs of the fifth layer 205 and the sixth layer 206 is e.g. 12 or more and 30 or less, and preferably 16 or more and 20 or less.

On the second stacked structure 220, a first stacked structure 210 is formed. For instance, $Al_{0.07}Ga_{0.925}In_{0.005}N$ layers constituting third layers 203 and $Ga_{0.93}In_{0.07}N$ layers constituting fourth layers 204 are alternately stacked. In this example, the third layer 203 is doped with Si at e.g. approximately $5 \times 10^{18}$ cm$^{-3}$. The thickness of each third layer 203 is e.g. 2 nm. The thickness of each fourth layer 204 is e.g. 1 nm. In this example, the number of pairs of the third layer 203 and the fourth layer 204 is 30.

On the first stacked structure 210, a light emitting unit 140 is formed. For instance, a Si-doped n-type $Al_{0.065}Ga_{0.93}In_{0.005}N$ film is formed as a first barrier layer BL1. The Si-doped n-type $Al_{0.065}Ga_{0.93}In_{0.005}N$ film has a Si concentration of e.g. $0.5 \times 10^{19}$ cm$^{-3}$ or more and $2 \times 10^{19}$ cm$^{-3}$ or less and a thickness of e.g. 13.5 nm. Further thereon, a $Ga_{0.93}In_{0.07}N$ layer (a thickness of 6 nm) is formed as a well layer 42. Further thereon, an $Al_{0.065}Ga_{0.93}In_{0.005}N$ film (a thickness of 6 nm) is formed as a second barrier layer BL2.

Further thereon, a Mg-doped p-type $Al_{0.25}Ga_{0.75}N$ film (a thickness of 24 nm) is formed as a p-type confinement layer (second layer 151). The Mg concentration in the portion on the light emitting unit 140 side of the p-type confinement layer is e.g. $0.8\times10^{19}$ cm$^{-3}$ or more and $5\times10^{19}$ cm$^{-3}$ or less. The Mg concentration in the portion on the opposite side from the light emitting unit 140 of the p-type confinement layer is e.g. $0.2\times10^{19}$ cm$^{-3}$ or more and $2\times10^{19}$ cm$^{-3}$ or less.

Further thereon, a Mg-doped p-type GaN film is formed as a p-type contact layer 150. The Mg concentration in the portion on the second layer 151 side of the Mg-doped p-type GaN film is e.g. $0.2\times10^{19}$ cm$^{-3}$ or more and $2\times10^{19}$ cm$^{-3}$ or less. The Mg concentration in the portion on the opposite side from the second layer 151 of the Mg-doped p-type GaN film is e.g. $5\times10^{19}$ cm$^{-3}$ or more and $20\times10^{19}$ cm$^{-3}$ or less.

The stacked body including these semiconductor layers is provided with electrodes by e.g. the method illustrated below.

The p-type semiconductor layer and the light emitting unit 140 are removed by dry etching using a mask. Thus, in a partial region of the stacked body, the n-type contact layer 130 is exposed. Entirely on the stacked body including the exposed surface of the n-type semiconductor layer, a $SiO_2$ film, not shown, is formed with a thickness of 400 nm by using a thermal CVD (chemical vapor deposition) apparatus.

To form a p-side electrode 160, first, a patterned resist for resist lift-off is formed on the stacked body. Then, the $SiO_2$ film on the p-type contact layer 150 is removed by ammonium fluoride treatment. On this region where the $SiO_2$ film is removed, for instance, by using a vacuum evaporation apparatus, a reflective and conductive Ag film is formed as a p-side electrode 160. The thickness of the Ag film is e.g. 200 nm. Then, for instance, sintering is performed for one minute in a nitrogen atmosphere at 350° C.

To form an n-side electrode 170, a patterned resist for resist lift-off is formed on the stacked body. Then, the $SiO_2$ film on the exposed n-type contact layer 130 is removed by ammonium fluoride treatment. On this region where the $SiO_2$ film is removed, a conductive film is formed as an n-side electrode 170. This conductive film is e.g. a stacked film of Ti film/Pt film/Au film. The thickness of this conductive film is 500 nm.

Alternatively, the n-side electrode 170 can also be made of a high reflectance silver alloy (e.g., including Pd at approximately 1%). In this case, to improve ohmic contact, the n-type contact layer 130 is formed in a two-layer structure. For instance, as an electrode formation portion, a high concentration layer is provided. The high concentration layer has a Si concentration of e.g. $0.6\times10^{19}$ cm$^{-3}$ or more and $3\times10^{19}$ cm$^{-3}$ or less and a thickness of e.g. 0.1 μm or more and 1 μm or less. This can suppress reliability decrease due to Si segregation.

Next, the rear surface of the substrate 110 (the surface on the opposite side from the first buffer layer 121) is polished. The substrate 110 and the stacked body are cut by e.g. cleavage or diamond blade cutting. Thus, a singulated LED device, i.e., the semiconductor light emitting device 10, is fabricated. The LED device has a width of e.g. 400 μm and a thickness of e.g. 100 μm.

The present inventors fabricated a semiconductor light emitting device according to the embodiment and evaluated its characteristics. In the following, the structure of this semiconductor light emitting device is described.

Figure 3:
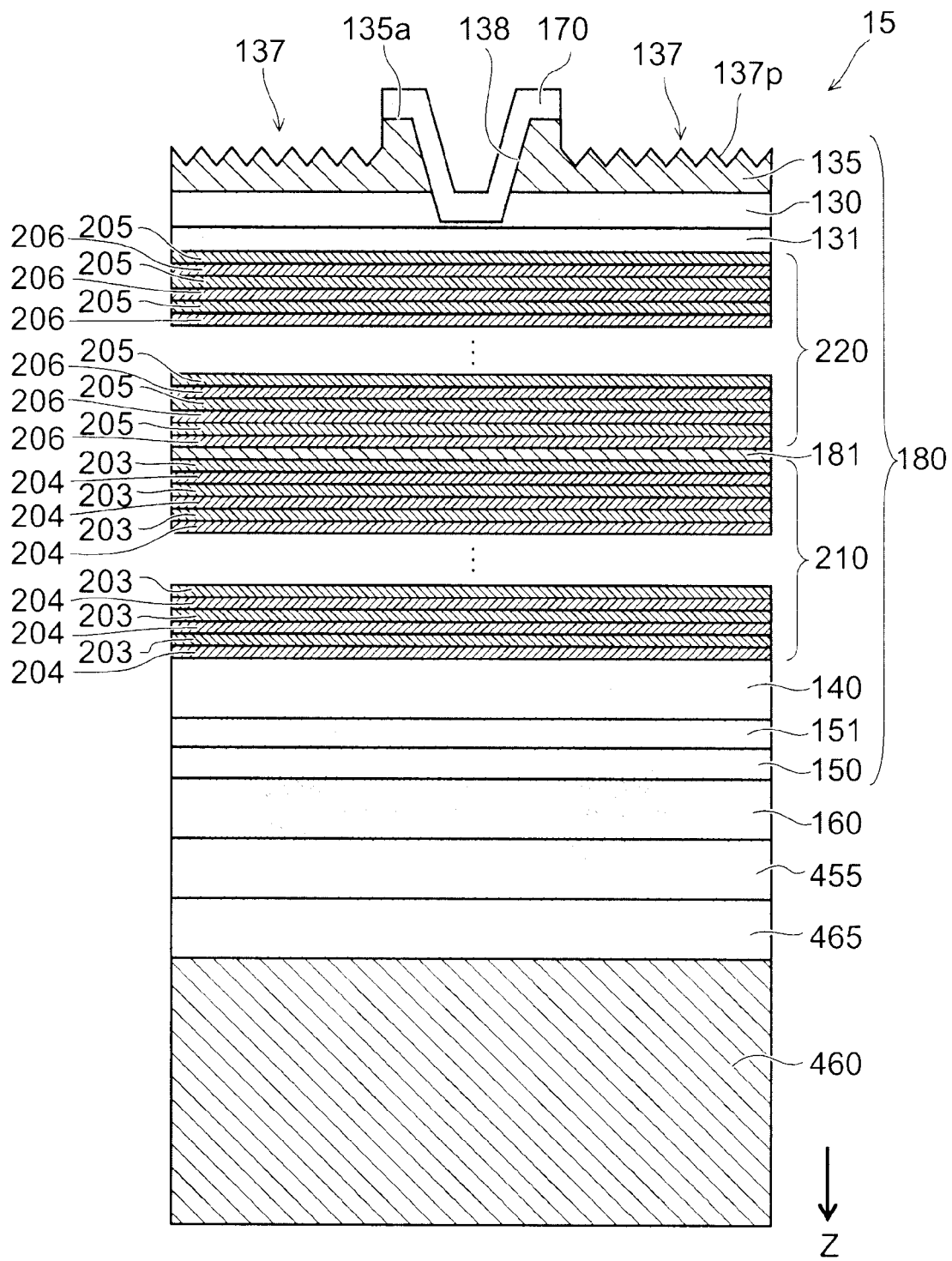
FIG. 3 is a schematic sectional view illustrating the configuration of an alternative semiconductor light emitting device according to the first embodiment.

FIG. 3 is a schematic sectional view illustrating the configuration of an alternative semiconductor light emitting device according to the first embodiment.

As shown in FIG. 3, in the fabricated semiconductor light emitting device 15, a first metal layer 455 is provided between a conductive substrate 460 and the p-side electrode 160. A second metal layer 465 is provided between the conductive substrate 460 and the first metal layer 455. Furthermore, an intermediate layer 181 is provided between the first stacked structure 210 and the second stacked structure 220.

An n-type contact layer 130 is provided on the opposite side of the first layer 131 from the light emitting unit 140. A low impurity concentration semiconductor layer 135 is provided on the opposite side of the n-type contact layer 130 from the first layer 131.

The impurity concentration in the low impurity concentration semiconductor layer 135 is lower than the impurity concentration in the n-type contact layer 130. The low impurity concentration semiconductor layer 135 can be a non-doped GaN layer. The low impurity concentration semiconductor layer 135 can be the second buffer layer 122 (lattice relaxation layer) described above.

The low impurity concentration semiconductor layer 135 is provided with an opening 138. The opening 138 exposes part of the n-type contact layer 130. From the major surface 135a of the low impurity concentration semiconductor layer 135 on the opposite side from the n-type contact layer 130, the opening 138 extends to the n-type contact layer 130. That is, the bottom of the opening 138 extends to the n-type contact layer 130.

The n-side electrode 170 is provided so as to cover the n-type contact layer 130 exposed in the opening 138 and part of the low impurity concentration semiconductor layer 135.

The major surface 135a of the low impurity concentration semiconductor layer 135 not covered with the n-side electrode 170 is provided with a rough surface portion 137 including an unevenness 137p.

The semiconductor light emitting device 15 was fabricated as follows.

On a sapphire substrate (not shown), an AlN layer having a thickness of 2 μm was formed as a first buffer layer 121 by the MOCVD method at approximately 1300° C. Further thereon, a GaN layer having a thickness of 2 μm was formed as a second buffer 122 by the MOCVD method at approximately 1200° C.

Further thereon, a GaN layer (n-type contact layer 130) having a thickness of 4 μm and a Si concentration of $0.2\times10^{19}$–$1.5\times10^{19}$ cm$^{-3}$ was formed by the MOCVD method at 1050-1200° C. Further thereon, an n-GaN layer (first layer 131) having a thickness of 0.5 μm and a Si concentration of $2\times10^{17}$–$5\times10^{18}$ cm$^{-3}$ was formed by the MOCVD method at 1050-1200° C.

Further thereon, GaN layers (fifth layers 205) having a thickness of 2.5 nm and doped with Si at $8\times10^{18}$ cm$^{-3}$ and sixth layers 206 of $Ga_{0.93}In_{0.07}N$ having a thickness of 1 nm were alternately stacked 16 layers by the MOCVD method at 800-900° C. Thus, a second stacked structure 220 is formed.

Further thereon, a GaN layer (intermediate layer 181) having a thickness of 2.5 nm was formed by the MOCVD method at 800-900° C.

Further thereon, $Al_{0.07}Ga_{0.925}In_{0.005}N$ layers (third layers 203) having a thickness of 2 nm and doped with Si at $8\times10^{18}$ cm$^{-3}$ and $Ga_{0.93}In_{0.07}N$ layers (fourth layers 204) having a thickness of 1 nm were alternately stacked 30 layers by the MOCVD method at 800-900° C. Thus, a first stacked structure 210 is formed.

Further thereon, an $Al_{0.07}Ga_{0.925}In_{0.005}N$ layer (first barrier layer BL1: barrier layer 41) having a thickness of 13.5 nm and doped with Si at $4\times10^{18}$–$16\times10^{18}$ cm$^{-3}$ was formed by the MOCVD method at approximately 850° C. Further thereon, a $Ga_{0.93}In_{0.07}N$ layer (well layer 42) having a thickness of 7 nm was formed by the MOCVD method at approximately 800-900° C. Further thereon, an $Al_{0.07}Ga_{0.925}In_{0.005}N$ layer (second barrier layer BL2: barrier layer 41) having a thickness of 4-12 nm was formed by the MOCVD method at approximately 800-900° C.

Further thereon, a Mg-doped p-$Al_{0.2}Ga_{0.8}N$ layer (second layer 151) having a thickness of 24 nm was formed by the MOCVD method at approximately 950-1100° C.

Further thereon, a p-GaN layer (contact layer 150) having a thickness of 0.3 μm was formed by the MOCVD method at 950-1100° C.

Further thereon, a p-side electrode 160 was formed. Further thereon, a first metal layer 455 was formed.

A conductive substrate 460 including a second metal layer 465 was prepared. The first metal layer 455 was bonded to the second metal layer 465. Subsequently, the sapphire substrate was removed by the laser lift-off method. An unevenness structure was formed by etching on the surface of the exposed n-GaN layer (n-type contact layer 130). Furthermore, by evaporation and lithograph-based patterning, an n-side electrode 170 having a prescribed shape was formed. The pattern of the n-side electrode 170 as viewed along the Z-axis includes a peripheral portion along the periphery of the n-type contact layer 130, and a cross-shaped portion. The cross-shaped portion includes a first extending portion passing through the X-axis center of the n-type contact layer 130 and extending along the Y-axis, and a second extending portion passing through the Y-axis center of the n-type contact layer 130 and extending along the X-axis. The above peripheral portion includes four sides along the four sides of the n-type contact layer 130. The central portion of each of the four sides is in contact with the end portion of the cross-shaped portion.

Subsequently, by dividing the workpiece into individual devices, the semiconductor light emitting device 15 is obtained. In the semiconductor light emitting device 15, the length along the X-axis is approximately 1 mm (millimeter), and the length along the Y-axis is approximately 1 mm.

The characteristics of the semiconductor light emitting device 15 thus fabricated were evaluated. In this evaluation, the characteristics of the following semiconductor light emitting device 91 of a first reference example were also evaluated. In the following, the structure of the semiconductor light emitting device of the first reference example is described.

Figure 4:
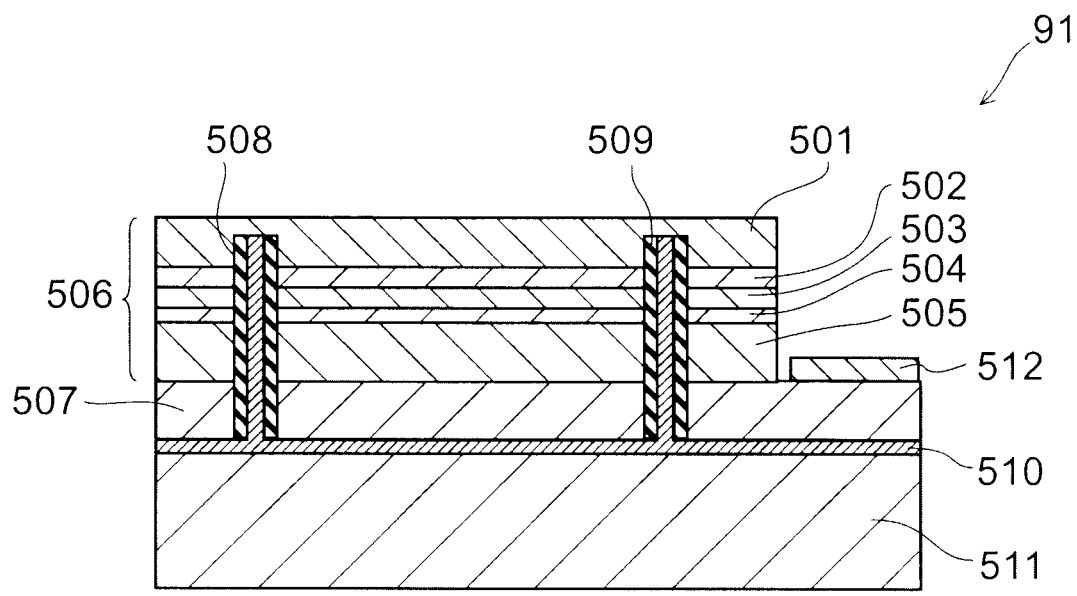
FIG. 4 is a schematic sectional view showing the configuration of a semiconductor light emitting device of a first reference example.

FIG. 4 is a schematic sectional view showing the configuration of a semiconductor light emitting device of the first reference example.

As shown in FIG. 4, in the semiconductor light emitting device 91 of the first reference example, on a sapphire substrate (not shown), a Si-doped n-GaN layer 501 of 5 μm, a superlattice layer 502 of AlGaN/GaN, an MQW light emitting layer 503, a p-AlGaN layer 504 of 30 nm, and a p-GaN layer 505 of 0.12 μm are stacked in this order by the MOCVD method. On the semiconductor layer 506 including these layers, a silver-based high reflectance p-electrode layer 507 is provided. A plurality of electrode extraction holes 508 are formed from the p-electrode layer 507 through the p-GaN layer 505, the p-AlGaN layer 504, the light emitting layer 503, and the superlattice layer 502 to the n-GaN layer 501.

An insulating layer 509 is provided so as to cover the p-electrode layer 507 and the electrode extraction holes 508. An n-electrode 510 covering the insulating layer 509 and reaching the n-GaN layer 501 is provided. Here, the sapphire substrate has been removed by the laser lift-off method. The n-electrode 510 is welded to a conductive substrate 511 via solder. Part of the semiconductor layer 506 is removed, and a p-electrode 512 in contact with the p-electrode layer 507 is provided. The semiconductor light emitting device 91 is shaped like a square approximately 1 mm on a side.

Figure 5:
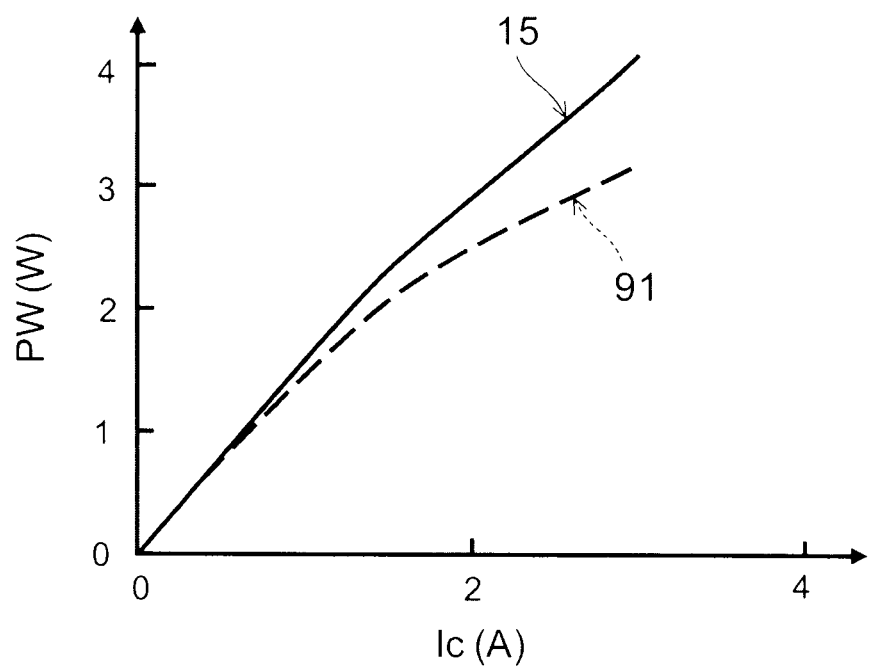
FIG. 5 is a graph illustrating the characteristics of the semiconductor light emitting devices.

FIG. 5 is a graph illustrating the characteristics of the semiconductor light emitting devices.

FIG. 5 illustrates the characteristics of the semiconductor light emitting device 15 according to the embodiment and the characteristics of the semiconductor light emitting device 91 of the first reference example. The semiconductor light emitting device 91 of the first reference example does not include the first stacked structure 210 and the second stacked structure 220. In FIG. 5, the horizontal axis represents current Ic (A, ampere), and the vertical axis represents optical output power PW (W, watt).

As seen from FIG. 5, the semiconductor light emitting device 15 according to the embodiment achieved higher light emission intensity than the semiconductor light emitting device 91 of the first reference example. That is, the embodiment can achieve high efficiency.

In the above semiconductor light emitting device 15, the intermediate layer 181 can be omitted. The intermediate layer 181 can be made of at least one of GaN, GaInN, AlGaN, AlGaIn, and AlN. The thickness of the intermediate layer 181 is preferably thinner than the thickness of the light emitting unit 140. If the intermediate layer 181 is thinner than the light emitting unit 140, the effect of the strain of the first stacked structure 210 can be transmitted not only to the light emitting unit 140 but also to the second stacked structure 220. The effect of the strain of the second stacked structure 220 is strongly received by the first stacked structure 210. Thus, an interaction effectively occurs therebetween.

As described with reference to FIG. 5, the semiconductor light emitting device 15 achieves high light emission intensity and high efficiency. Based on these experimental facts, the configuration of the semiconductor light emitting device according to the embodiment is derived. Example characteristics of the semiconductor light emitting device contributing to the high light emission intensity and high efficiency are now described. In the following, as a semiconductor light emitting device according to the embodiment, the semiconductor light emitting device 10 is described.

The third layer 203 is e.g. a low strain layer. The fourth layer 204 is e.g. a high strain layer having a higher level of strain than the third layer 203.

The crystal inside the first stacked structure 210 is subjected to strain. Thus, the quality of the crystal is improved. This improves the crystal quality of the semiconductor layers (e.g., the light emitting unit 140, and particularly the well layer 42 thereof) provided on the first stacked structure 210. Thus, high light emission efficiency can be achieved. That is, the configuration of the first stacked structure 210 is optimized so as to maximize the crystal quality of e.g. the well layer 42.

The well layer 42 has lattice mismatch with the GaN layer. Hence, in the well layers 42 stacked on the first stacked structure 210, the strain is accumulated. Here, by optimizing the number of repetitions of the stacked third layers 203 and fourth layers 204 in the first stacked structure 210, the crystal quality in the first stacked structure 210 is improved. Furthermore, this can suppress that the total strain in the first stacked structure 210 and the well layer 42 exceeds the limit to degrade the crystal characteristics of the well layer 42.

The sum of the total thickness of the plurality of fourth layers 204 and the thickness of the well layer 42 is set to e.g. 25 nm or more and 45 nm or less. This enables good crystal growth with the characteristics of high light emission intensity and small emission spectrum broadening.

In particular, in the case where the sum of the total thickness of the plurality of fourth layers 204 and the thickness of the well layer 42 is 30 nm or more and 35 nm or less, a particularly good crystal is obtained.

The reason for this is considered as follows. By setting the sum of the total thickness of the plurality of fourth layers 204 and the thickness of the well layer 42 to 25 nm or more and 45 nm or less, the total amount of strain including the composition fluctuations in the crystal corresponds to around the upper limit in the range of no crystal degradation.

In the first stacked structure 210 including a plurality of third layers 203 and a plurality of fourth layers 204, the direction of the dislocation extending from the crystal lower portion (e.g., second buffer layer 122) to the first stacked structure 210 changes in the first stacked structure 210. The present inventors have found that the direction of the dislocation is made close to perpendicular to the c-plane of the surface of the first stacked structure 210. That is, the direction of the dislocation of the crystal is made close to the direction (i.e., the Z-axis direction, which is the stacking direction) perpendicular to the crystal surface. This corresponds to shortening of the length of the dislocation of the crystal in the light emitting unit 140 as viewed in the stacking direction. That is, this corresponds to reduction of the area of the defect region in the light emitting unit 140 as viewed in the stacking direction.

That is, it is considered that by adopting the first stacked structure 210, the quality of the crystal formed on the first stacked structure 210 is improved.

Furthermore, the present inventors have found that by providing the second stacked structure 220, the flatness of the crystal surface is improved.

The reason for this is considered as follows. GaN used for the fifth layer 205 is a binary system. Hence, there is a large effect of improving the lateral uniformity during the growth of GaN.

By using the second stacked structure 220 capable of improving the flatness, the flatness of the light emitting unit 140 (particularly the well layer 42) is improved. As a result, the characteristics of the crystal can be improved. Thus, the light emission efficiency can be increased. Furthermore, by improving the flatness, the flatness of semiconductor layers other than the well layer 42 can be improved. This effect can also contribute to increasing the light emission efficiency.

Furthermore, in the semiconductor light emitting device 10, it has turned out that the light emission efficiency is increased by combining the second stacked structure 220 having a high effect of improving flatness and the first stacked structure 210 having a high effect of improving crystallinity.

By introducing strain using the second stacked structure 220 having a high effect of improving flatness, the direction of the dislocation in the crystal can be made close to the direction perpendicular to the crystal surface (the direction parallel to the stacking direction) while maintaining the flatness of the crystal surface. Furthermore, by introducing the first stacked structure 210, the dislocation is made even closer to the direction perpendicular to the crystal surface. The reason for this is considered as follows. The lattice mismatch between the third layer 203 (AlGaInN layer) and the fourth layer 204 (GaInN layer) in the first stacked structure 210 is larger than the lattice mismatch between the fifth layer 205 (GaN layer) and the sixth layer 206 (GaInN layer) in the second stacked structure 220. Hence, it is considered that the first stacked structure 210 has a larger force of bending the dislocation than the second stacked structure 220.

In the embodiment, the second stacked structure 220 and the first stacked structure 210 are combined. The second stacked structure 220 has a small lattice mismatch between the layers and hence a small force of bending the dislocation. However, the second stacked structure 220 has high surface flatness. The first stacked structure 210 has a large lattice mismatch between the layers and hence a large force of bending the dislocation. By this combination, the dislocation can be made close to the direction perpendicular to the crystal surface more effectively without degrading the flatness of the crystal surface. This enables growth of a crystal with higher quality.

The foregoing has described the case where the third layer 203 includes AlGaInN and the fifth layer 205 includes GaN. Alternatively, the third layer 203 may include GaN, and the fifth layer 205 may include AlGaInN. In this case, the first stacked structure 210 serves as a layer having a high effect of improving flatness, and the second stacked structure 220 serves as a layer having a high effect of improving crystallinity. In the embodiment, the vertical relationship between the layer having a high effect of improving crystallinity and the layer having a high effect of improving flatness is arbitrary. In the configuration of the third layer 203 including AlGaInN and the fifth layer 205 including GaN, the effect of improving crystallinity and flatness is achieved more easily, and the effect of increasing the efficiency in the light emitting unit 140 is higher.

The lower limit of the thickness of the fourth layer 204 is determined by the thickness such that the fourth layer 204 exhibits material properties of a continuous layer. The upper limit of the thickness of the fourth layer 204 is determined by the condition for providing a difference between the energy of the absorption edge in the fourth layer 204 and the energy of the absorption edge in the well layer 42.

That is, the thickness of the fourth layer 204 is e.g. a thickness of three atomic layers or more. The thickness of the fourth layer 204 is set less than or equal to the thickness such that the energy of the absorption edge in the fourth layer 204 is sufficiently larger than that of the absorption edge of the well layer 42. Specifically, the wavelength corresponding to the energy of the absorption edge of the fourth layer 204 is set on the short wavelength side of the wavelength at which the intensity of the emission spectrum of the well layer 42 falls below half the peak value. The thickness of the well layer 42 is e.g. a thickness of four atomic layers or more.

The thickness of the third layer 203 is e.g. a thickness of three atomic layers or more and 6 nm or less. The lower limit is the minimum thickness exhibiting characteristics similar to those of a continuous layer. The upper limit is the thickness at which the influence of overlap of wave functions penetrated from both sides remains and causes decrease of resistivity.

For instance, the Al composition of the third layer 203 is set similar to that (an Al concentration of approximately 10% or less) of the barrier layer 41 (e.g., first barrier layer BL1). This can reduce the resistance of barriers against electrons, and can achieve high quality crystal growth.

The third layer 203 is doped with Si. The Si concentration in the third layer 203 is e.g. $1 \times 10^{17}$ cm$^{-3}$ or more and $2 \times 10^{19}$ cm$^{-3}$ or less. At less than $1 \times 10^{17}$ cm$^{-3}$, for instance, the electrical resistance is increased. Above $2 \times 10^{19}$ cm$^{-3}$, for instance, the crystallinity is decreased.

For instance, if the same composition is applied to the third layer 203 and the barrier layer 41 (e.g., first barrier layer BL1), the third layer 203 can be grown under the same condition as the barrier layer 41. This simplifies the process. Furthermore, before growing the barrier layer 41, through the growth of the third layer 203, preparation under the same growth condition as the barrier layer 41 can be performed for a sufficient period of time. This can improve the controllability of the barrier layer 41 (e.g., first barrier layer BL1).

For instance, if the same composition is applied to the fourth layer 204 and the well layer 42, the fourth layer 204 can be grown under the same condition as the well layer 42. This simplifies the process. Furthermore, before growing the well layer 42, through the growth of the fourth layer 204, preparation under the same growth condition as the well layer 42 can be performed for a sufficient period of time. This can improve the controllability of the well layer 42.

Alternatively, for instance, the fourth layer 204 can be made of GaInN having lower In concentration and larger bandgap than the well layer 42. This can reduce absorption of the light emission from the well layer 42 into the fourth layer 204. Furthermore, in this case, because of low absorption, the fourth layer 204 can be made thicker, and the number of pairs of the third layer 203 and the fourth layer 204 can be increased.

On the other hand, the thickness of the fifth layer 205 is e.g. a thickness of three atomic layers or more and 6 nm or less. The lower limit is the minimum thickness exhibiting characteristics similar to those of a continuous layer. The upper limit is the thickness at which the influence of overlap of wave functions penetrated from both sides remains and causes decrease of resistivity. The thickness of the fifth layer 205 is e.g. 2.5 nm. The fifth layer 205 is doped with e.g. Si. The Si concentration in the fifth layer 205 is e.g. $10 \times 10^{17}$ cm$^{-3}$ or more and $2 \times 10^{19}$ cm$^{-3}$ or less. At less than $10 \times 10^{17}$ cm$^{-3}$, for instance, the electrical resistance is increased. Above $2 \times 10^{19}$ cm$^{-3}$, for instance, the crystallinity is decreased. The Si concentration in the fifth layer 205 is e.g. $1.2 \times 10^{18}$ cm$^{-3}$.

The thickness of the sixth layer 206 is e.g. a thickness of three atomic layers or more. The thickness of the sixth layer 206 is set less than or equal to the thickness such that the energy of the absorption edge in the sixth layer 206 is sufficiently larger than that of the absorption edge of the well layer 42. Specifically, the thickness of the sixth layer 206 is set so that the wavelength corresponding to the energy of the absorption edge of the sixth layer 206 is set on the short wavelength side of the wavelength at which the intensity of the emission spectrum of the well layer 42 falls below half the peak value. The thickness of the sixth layer 206 is e.g. 1 nm.

The number of pairs of the fifth layer 205 and the sixth layer 206 is arbitrary, not limited to 30. The number of fifth layers 205 may be equal to the number of sixth layers 206. The number of fifth layers 205 may be larger by one than the number of sixth layers 206. Alternatively, the number of fifth layers 205 may be smaller by one than the number of sixth layers 206.

In the case of growing the second stacked structure 220 at low temperature in conformity with the sixth layer 206, growth at decreased temperature can be started from the sixth layer 206. This facilitates growing a high quality crystal even at low temperature. If the number of sixth layers 206 is increased, the growth can be started from a flatter layer. This enables crystal growth with particularly high quality.

In the embodiment, the number of pairs of the third layer 203 and the fourth layer 204 in the first stacked structure 210 may be equal to or different from the number of pairs of the fifth layer 205 and the sixth layer 206 in the second stacked structure 220.

In the embodiment, on a substrate 110 made of sapphire, a first buffer layer 121 (AlN layer) and a second buffer layer 122 (non-doped GaN layer) are formed. Further thereon, an n-type contact layer 130 (n-type GaN layer) is formed at high temperature. Thus, a high quality GaN crystal having low dislocation density is obtained. Hence, the n-type confinement layer (first layer 131) has good crystal quality, and the light emitting unit 140 formed further thereon has high crystal quality.

In the crystal of the light emitting unit 140 according to the embodiment, most of the dislocations are independent. There are few occurrences in which a plurality of dislocations are entangled in contact with each other. Thus, the effect of improving the crystal characteristics by aligning the direction of the dislocation with the direction perpendicular to the crystal surface is directly achieved. Thus, by combining the first stacked structure 210 with the above combination of buffer layers, the effect of improving the crystal quality by the first stacked structure 210 is achieved more significantly.

In the embodiment, the first barrier layer BL1 can be formed in a two-layer structure to combine an AlGaN layer having high Al concentration and an AlGaInN layer having low Al concentration. In such a structure, the AlGaN layer can suppress overflow of holes. Furthermore, the AlGaInN layer can improve the characteristics of the crystal surface. Moreover, the well layer 42 can be formed on the crystal surface with improved characteristics. For instance, by increasing the growth temperature to 1000° C., as part of the first barrier layer BL1, an AlGaN layer (an Al concentration of 20% or more and 26% or less) and a part of AlGaInN layer (an Al concentration of 8%) are grown. Then, by decreasing the growth temperature, as the rest of the first barrier layer BL1, a part of AlGaN layer and a well layer 42 are grown. This can realize a semiconductor light emitting device in which the hole overflow is small, the well layer 42 has high light emission efficiency, and the optical output is high from low current to high current.

To realize a semiconductor light emitting device with high efficiency, preferably, the well layer 42 for emitting light and the barrier layers 41 on both sides thereof are grown substantially continuously. This can reduce interface defects resulting from interruption of the growth. Here, a heterojunction interface exists between the i-th barrier layer BLi and the i-th well layer WLi, and between the i-th well layer WLi and the (i+1)-th barrier layer BL(i+1). Hence, at this interface, the growth is interrupted to adjust the raw material supply condition. The duration for this interruption is e.g. 0 seconds or more and 10 seconds or less. The continuous growth except the short duration of this growth interruption is referred to as substantially continuous growth.

In general, in a thin multiple quantum well using a GaInN layer as a well layer 42, the GaInN layer has high In concentration and is suitable for crystal growth at low temperature. On the other hand, in the barrier layer 41 including Al, Al is strongly coupled to nitrogen. Hence, it is preferable to use high growth temperature. Thus, if the well layer 42 including GaInN with high In concentration and the barrier layer 41 including Al are continuously grown at the same temperature, it is difficult to select a growth condition optimal for both the well layer 42 and the barrier layer 41.

If a single, thick well layer 42 is used in the light emitting unit 140, the shift of light emission energy due to the quantum effect is small. Thus, a GaInN layer having low In concentration and large bandgap can be used for the well layer 42. This enables growth at high temperature.

On the other hand, if the barrier layer 41 (e.g., first barrier layer BL1 and second barrier layer BL2) is doped with In, this can facilitate the motion of atoms at the crystal surface during crystal growth. Thus, the AlGaInN containing Al can be grown at low temperature. Because the incorporation efficiency of In is low, a large amount of In raw material is supplied to the crystal surface for doping with a small amount of In. This facilitates the motion of atoms at the crystal surface and enables crystal growth at low temperature. That is, with regard to the well layer and the barrier layer used in the semiconductor light emitting device and the wafer according to the embodiment, the well layer 42 can be grown at high temperature, and the barrier layer 41 (e.g., first barrier layer BL1 and second barrier layer BL2) can be grown at low temperature. Thus, at a substantially constant temperature (e.g., without intentionally changing the temperature), substantially continuous growth can be performed. Hence, in the semiconductor light emitting device and the wafer according to the embodiment, crystal defects at the interface adjacent to the well layer 42 can be reduced.

That is, the semiconductor light emitting device and the wafer according to the embodiment can be manufactured by a method for substantially continuously growing the well layer 42 and the barrier layers 41 on both sides thereof. Thus, a semiconductor light emitting device and a wafer having high light emission efficiency particularly in the low current region can be formed.

In the embodiment, the first stacked structure 210 can be grown at substantially the same temperature as the light emitting unit 140 (well layer 42 and barrier layer 41). Furthermore, the second stacked structure 220 can be grown at substantially the same temperature as the light emitting unit 140.

By providing the first stacked structure 210, the direction of the dislocation in the crystal is changed. Thus, it is expected that a well layer 42 having high light emission efficiency can be formed on the first stacked structure 210. However, if the growth temperature is changed for the first stacked structure 210 and the light emitting unit 140, the propagation direction of the defect is changed. This causes concern that the characteristics of the light emitting unit 140 cannot be improved even if the first stacked structure 210 is provided. Thus, preferably, the first stacked structure 210 is grown at substantially the same temperature as the light emitting unit 140.

As described above, in the semiconductor light emitting device according to the embodiment, the well layer 42 and the barrier layer (first barrier layer BL1 and second barrier layer BL2) can be grown at substantially the same temperature. On the other hand, the materials selected for e.g. the third layer 203 and the fourth layer 204 of the first stacked structure 210 can be a combination of materials which are similar (or e.g. identical) to those of the barrier layer 41 and the well layer 42, respectively, and enable good crystal growth at the same growth temperature as the barrier layer 41 and the well layer 42. Thus, the crystal of the first stacked structure 210 and the light emitting unit 140 with good characteristics can be easily grown at substantially the same temperature.

In a semiconductor light emitting device and a wafer including many stacked layers and having a complicated configuration, if each layer has a different optimal growth condition, the selection of the condition requires time. Thus, it is difficult to produce a device in which effectively all the layers have good characteristics. In the semiconductor light emitting device and the wafer according to the embodiment, the first stacked structure 210 and the second stacked structure 220 are grown at substantially the same temperature as the light emitting unit 140. This easily enables crystal growth with high quality under the optimal growth condition. Thus, a semiconductor light emitting device and a wafer having high light emission efficiency can be easily manufactured.

In the embodiment, the third layer 203 can be made thinner than the fifth layer 205. For instance, the thickness of the third layer 203 can be set to 2 nm. The thickness of the fourth layer 204 can be set to 1 nm. The thickness of the fifth layer 205 can be set to 2.5 nm. The thickness of the sixth layer 206 can be set to 1 nm.

The third layer 203 is made thinner than the fifth layer 205 for the following reason. To reduce the influence of the well layer 42 on optical absorption, the absorption wavelength in the first stacked structure 210 and the second stacked structure 220 is preferably made as short as possible. The third layer 203 includes Al. Hence, the third layer 203 has a larger bandgap than the fifth layer 205 (GaN layer). Thus, to equalize the energy levels in the first stacked structure 210 and the second stacked structure 220, the third layer 203 is made thinner than the fifth layer 205. This can increase the average In concentration in the first stacked structure 210. Thus, the crystal characteristics can be improved more efficiently with thin thickness.

In the embodiment, the fourth layer 204 can be made thicker than the sixth layer 206. Furthermore, the In concentration of the fourth layer 204 can be made higher than that of the sixth layer 206. The reason for this is as follows. To reduce the influence of the well layer on optical absorption, the absorption wavelength in the first stacked structure 210 and the second stacked structure 220 is preferably made as short as possible. The third layer 203 includes Al. Hence, the third layer 203 has a larger bandgap than the fifth layer 205 (GaN layer). Thus, to equalize the energy levels formed in the fourth layer 204 and the sixth layer 206, it is possible to apply at least one of thickening the thickness of the fourth layer 204 and increasing the In concentration in the fourth layer 204. Then, the average In concentration in the first stacked structure 210 can be made higher than that in the second stacked structure 220. Thus, the crystal characteristics can be improved more efficiently.

In the embodiment, in the case of stacking 12 pairs of the fifth layer 205 and the sixth layer 206 in the second stacked structure 220, the surface was flatter than in the case of no second stacked structure 220. However, conspicuous unevenness was observed at the crystal surface by an optical microscope. In contrast, in the case of stacking 16 pairs of the fifth layer 205 and the sixth layer 206, the surface flatness was improved. Furthermore, in each case of stacking 18 pairs, 20 pairs, 27 pairs, and 30 pairs, a semiconductor light emitting device with high optical output was obtained. Thus, the number of pairs of the fifth layer 205 and the sixth layer 206 is preferably 12 or more and 30 or less. However, in the case of stacking 27 pairs, increase of defects in the crystal was also observed. Thus, more preferably, the number of pairs of the fifth layer 205 and the sixth layer 206 is 16 or more and 20 or less.

In the embodiment, the Si concentration in the first barrier layer BL1 is preferably as high as possible. The reason for this is as follows. By Si doping, the source of sufficient positive charges is introduced into the first barrier layer BL1. This can suppress the influence of the electric field applied to the well layer 42 due to the effect of the piezoelectric field. However, high Si concentration degrades the crystal quality. Thus, by increasing the Si concentration only in the thin first barrier layer BL1, the effect of the piezoelectric field can be suppressed while suppressing the characteristics degradation of the crystal.

To suppress the characteristics degradation of the crystal, the Si concentration in the first stacked structure 210 is preferably made lower than that in the first barrier layer BL1.

On the other hand, if the discontinuity of the energy band of the heterostructure in the first stacked structure 210 (AlGaInN layers and GaInN layers) is larger than the discontinuity of the energy band of the heterostructure in the second stacked structure 220 (GaN layers and GaInN layers). Thus, to reduce the electrical resistance of the semiconductor light emitting device, the first stacked structure 210 is preferably doped with Si at higher concentration than the second stacked structure 220. However, if the Si concentration in the first stacked structure 210 is too high, the characteristics of the crystal may be degraded. Hence, the second stacked structure 220 is also doped with Si at a sufficient concentration corresponding to the heterostructure of the GaN layer and the GaInN layer.

On the other hand, high Si concentration of the second barrier layer BL2 causes carrier overflow and internal absorption. Hence, the Si concentration in the second barrier layer BL2 is preferably low.

Based on the foregoing, the Si concentration in the first barrier layer BL1 (the barrier layer 41 of the plurality of barrier layers 41 nearest to the first stacked structure 210) is set higher than the Si concentration in the first stacked structure 210. Furthermore, the Si concentration in the second stacked structure 220 is set lower than the Si concentration in the first stacked structure 210. The Si concentration in the barrier layers 41 except the first barrier layer BL1 of the plurality of barrier layers 41 (e.g., second barrier layer BL2 to (n+1)-th barrier layer BL(n+1) (n is an integer of 1 or more)) is set lower than the Si concentration in the second stacked structure 220. The Si concentration in the first layer 131 is set lower than the Si concentration in the second stacked structure 220.

By adopting such a distribution of Si concentration, the crystal characteristics are improved. Furthermore, the influence of the effect of the piezoelectric field is suppressed. Hence, the light emission efficiency can be increased. Furthermore, the electrical resistance is low, and the influence of e.g. carrier overflow is reduced. Hence, the light emission efficiency can be increased. Thus, the semiconductor light emitting device 10 according to the embodiment can realize a semiconductor light emitting device for emitting near ultraviolet light with high efficiency.

According to experiments by the present inventors, the following knowledge has been obtained. If a semiconductor light emitting device based on nitride semiconductor (e.g., GaN) is provided on a sapphire substrate, crystal defects occur in the GaN crystal (e.g., GaN buffer layer) due to lattice mismatch between the sapphire substrate and GaN. The influence of such defects is reduced by stacking layers having high strain on the GaN layer. Then, if an MQW structure including a plurality of well layers made of GaInN is formed on the layer having high strain, strain occurs because the lattice constant of the well layer is different from that of the GaN layer. Thus, the influence of crystal defects is reduced by the plurality of well layers. That is, if a plurality of well layers are stacked, with the increase of stacked well layers, a high quality crystal less susceptible to crystal defects can be grown. However, if the total thickness of lattice mismatched layers becomes thick, the amount of strain becomes too large, and the crystal quality is degraded again.

According to experiments by the present inventors, the following knowledge has also been obtained. In the wafer (semiconductor light emitting device) using Ga(Al)InN in the light emitting unit, the sensitivity of the crystal quality greatly depends on the emission wavelength. Specifically, on the long wavelength side above a wavelength of 400 nm, the variation of the light emission efficiency is small even if the crystal quality is degraded. However, on the short wavelength side of 400 nm or less, the light emission efficiency sharply decreases as the emission wavelength becomes shorter. More specifically, at a short wavelength of 400 nm or less, the short wavelength side of each spectrum decreases as if it cannot exceed a kind of envelope. Thus, the light emission efficiency decreases as the emission wavelength becomes shorter. However, in a high quality crystal, the decrease of light emission efficiency is limited even if the emission wavelength becomes a short wavelength of 400 nm or less. In this case, if the wavelength (peak wavelength) becomes shorter, the overall spectrum is shifted to the short wavelength side without significant variation. Thus, in particular, by realizing the growth of a high quality crystal, light emission with high efficiency can be realized particularly in the near ultraviolet wavelength region of 400 nm or less.

Based on these experimental results, the present inventors have conjectured that the well layer with good crystal quality can be formed only as a single layer. Thus, it is considered that the light emission efficiency is maximized by optimizing each layer included in the semiconductor light emitting device so as to maximize the crystal quality in one well layer. Furthermore, the present inventors have conjectured that such a method can be used to enable light emission with high efficiency even in a semiconductor light emitting device for emitting near ultraviolet light with a wavelength of 400 nm or less, which is particularly suitable for application of high quality crystal.

The semiconductor light emitting device 10 includes semiconductor layers including an n-type semiconductor layer, a p-type semiconductor layer, and a light emitting unit 140 provided between the n-type semiconductor layer and the p-type semiconductor layer. These semiconductor layers can be made of a nitride semiconductor.

These semiconductor layers can be formed by using such techniques as the metal organic chemical vapor deposition method and the molecular beam epitaxy method. However, in the embodiment, the method for forming the semiconductor layers is arbitrary.

In the embodiment, the substrate 110 can be a substrate made of e.g. sapphire, SiC, GaN, GaAs, and Si. However, in the embodiment, the substrate 110 is arbitrary. The substrate 110 may be removed after crystal growth.

The semiconductor light emitting device 10 is based on the configuration for facilitating the use of a thick p-type confinement layer (second layer 151) having high Al concentration. This increases the efficiency of the light emitting unit 140 itself and suppresses the overflow of electrons from the light emitting unit 140. Thus, crystal defects are reduced to achieve high efficiency. This effect is particularly significant in the near ultraviolet wavelength region.

The relationship between the piezoelectric field applied to the first well layer WL1 and the Si concentration distribution in the first barrier layer BL1 and the second barrier layer BL2 is now described.

A piezoelectric field is applied to the well layer 42. Hence, at the interface between the well layer 42 and the second barrier layer BL2, positive charges seep out of the well layer 42 into the second barrier layer BL2. On the other hand, at the interface between the well layer 42 and the first barrier layer BL1, negative charges seep out of the well layer 42 into the first barrier layer BL1.

The portion on the p-type confinement layer (second layer 151) side of the well layer 42 includes many electrons. Thus, supply of electrons from the second barrier layer BL2 may be low. Hence, in the barrier layer (second barrier layer BL2) in contact with this interface, the Si concentration may be low. That is, the second barrier layer BL2 does not need to be intentionally doped with Si.

On the other hand, the portion on the n-type confinement layer (first layer 131) side of the well layer 42 does not include many electrons. Thus, preferably, electrons are efficiently supplied from the portion on the first barrier layer BL1 side toward the well layer 42. Hence, in the first barrier layer BL1 in contact with this interface, the Si concentration is preferably set high. That is, the first barrier layer BL1 is doped with Si at high concentration.

Specifically, the Si concentration in the first barrier layer BL1 is preferably $0.5 \times 10^{19}$ cm$^{-3}$ or more and $2 \times 10^{19}$ cm$^{-3}$ or less. Furthermore, the Si concentration set to $1.0 \times 10^{19}$ cm$^{-3}$ or more and $1.2 \times 10^{19}$ cm$^{-3}$ or less enables electron supply at high concentration without degrading the crystal. In the range of Si concentration of $1.2 \times 10^{19}$ cm$^{-3}$ or more and $1.5 \times 10^{19}$ cm$^{-3}$ or less, the emission spectrum may exhibit broadening, which is presumably associated with the degradation of the crystal. However, electron supply can be increased, and the light emission intensity is high.

On the p-type confinement layer (second layer 151) side of the first well layer WL1, the second barrier layer BL2 with low Si concentration is placed. On the n-type confinement layer (first layer 131) side of the well layer 42, the first barrier layer BL1 with high Si concentration is placed. This can increase the light emission efficiency of the first well layer WL1.

For each well layer 42, a region with high Si concentration is provided on the first layer 131 side of each barrier layer 41, and a region with low Si concentration is provided on the second layer 151 side of each barrier layer 41. This can increase the light emission efficiency of each well layer 42. Here, the first barrier layer BL1 does not need to be provided with a region with low Si concentration. The (n+1)-th barrier layer BL(n+1) does not need to be provided with a region with high Si concentration.

In the light emitting unit 140, the average Si concentration increases in the direction from the p-type confinement layer (second layer 151) side to the n-side confinement layer (first layer 131) side. This can increase the total light emission efficiency of the light emitting unit 140.

In addition, the half-width of the emission spectrum can be reduced.

In the following, by taking the first well layer WL1 as an example, the relationship between the Si concentration and the emission spectrum is described.

At the interface of the first barrier layer BL1 in contact with the well layer 42, a large amount of electrons flow into the well layer 42 from Si doped at high concentration. Thus, a large amount of charged Si atoms are left on the first barrier layer BL1 side. The distribution of electron concentration and Si concentration at this interface serves to cancel the piezoelectric field. This results in weakening the piezoelectric field. If the piezoelectric field is weakened, the energy band of the light emitting unit 140 bent by the piezoelectric field becomes flat. This increases the light emission efficiency. Then, the half-width of the emission spectrum is narrowed.

In the semiconductor light emitting device 10, by controlling the impurity concentration in the light emitting unit 140, the electric field in the light emitting unit 140 is controlled to increase the light emission efficiency. Thus, a semiconductor light emitting device with high efficiency can be provided.

Furthermore, in the semiconductor light emitting device 10, the Si concentration in the i-th barrier layer BLi ($1 < i \leq n+1$) is set lower than the Si concentration in the first barrier layer BL1. Thus, the reliability can be improved, and the driving voltage of the semiconductor light emitting device 10 can be reduced.

By decreasing the Si concentration in the (n+1)-th barrier layer BL(n+1), the overflow of electrons from the well layer 42 to the p-type confinement layer (second layer 151) side is decreased. This improves the reliability of the semiconductor light emitting device 10.

Furthermore, by decreasing the Si concentration in the (n+1)-th barrier layer BL(n+1), the height of the energy of the (n+1)-th barrier layer BL(n+1) is lowered. This facilitates injection of holes. Thus, the driving voltage of the semiconductor light emitting device 10 can be reduced.

Thus, the Al concentration in the p-type confinement layer (second layer 151) can be decreased. This improves the reliability of the device. For instance, if the Si concentration in the (n+1)-th barrier layer BL(n+1) is set to approximately $1 \times 10^{19}$ cm$^{-3}$, the Al concentration in the p-type confinement layer (second layer 151) is set to 25% or more. In the case where the (n+1)-th barrier layer BL(n+1) is not doped with Si, the Al concentration in the p-type confinement layer (second layer 151) can be decreased to 20%.

As described above, in the semiconductor light emitting device 10 according to the embodiment, the Si concentration in the barrier layers 41 other than the first barrier layer BL1 is made lower to increase the light emission efficiency. Thus, the embodiment can provide a semiconductor light emitting device having high efficiency, high reliability, and low driving voltage.

The Si concentration in the second barrier layer BL2 may be uniform, or may be varied along e.g. the thickness direction. For instance, the second barrier layer BL2 may include a first portion with high Si concentration and a second portion with low Si concentration. In this case, the distribution of Si concentration may be varied stepwise or continuously. More preferably, the average Si concentration in the i-th barrier layer BLi ($1 < i \leq n+1$) is set lower than that in the first barrier layer BL1.

Examples of each layer which can be included in the semiconductor light emitting device 10 are now described.

The first AlN buffer layer 121a of high carbon concentration serves to relax the difference in crystal type from the substrate 110. In particular, the first AlN buffer layer 121a reduces screw dislocations. Furthermore, by the second AlN buffer layer 121b of high purity, the surface of the second AlN buffer layer 121b is flattened at the atomic level. This reduces crystal defects in the non-doped GaN buffer layer (second buffer layer 122) grown thereon. The thickness of the second AlN buffer layer 121b of high purity is preferably thicker than 1 μm. This can effectively reduce crystal defects in the non-doped GaN buffer layer (second buffer layer 122). To suppress strain-induced warpage, the thickness of the second AlN buffer layer 121b of high purity is preferably 4 μm or less.

The first buffer layer 121 can be made of AlN as described above. However, the embodiment is not limited thereto. The first buffer layer 121 may be made of e.g. Al$_{\alpha 2}$Ga$_{1-\alpha 2}$N ($0.8 \leq \alpha 2 \leq 1$). If the first buffer layer 121 is made of Al$_{\alpha 2}$Ga$_{1-\alpha 2}$N ($0.8 \leq \alpha 2 \leq 1$), the wafer warpage can be compensated by adjusting the Al concentration.

The second buffer layer 122 (lattice relaxation layer) serves for defect reduction and strain relaxation by three-dimensional island growth on the first buffer layer 121. To flatten the growth surface, the average thickness of the second buffer layer 122 (lattice relaxation layer) is preferably set to 0.6 μm or more. In view of reproducibility and warpage reduction, the thickness of the second buffer layer 122 (lattice relaxation layer) is preferably 0.8 μm or more and 2 μm or less.

By adopting these buffer layers, the dislocation density can be reduced to 1/10 or less compared with conventional low temperature growth buffer layers. This enables crystal growth at such high growth temperature and high ratio of group V raw material to group III raw material that are otherwise difficult to adopt due to abnormal growth. Thus, generation of point defects is suppressed. This enables high concentration doping of the AlGaN layer and the barrier layer (first barrier layer BL1 and second barrier layer BL2) with high Al concentration.

The first barrier layer BL1 can include e.g. a Si-doped quaternary mixed crystal of AlGaInN (an Al composition of 6% or more and 10% or less, and an In concentration of 0.3% or more and 1.0% or less). The second barrier layer BL2 includes e.g. a quaternary mixed crystal of AlGaInN (an Al composition of 6% or more and 10% or less, and an In concentration of 0.3% or more and 1.0% or less), where Si doping is arbitrary. The well layer 42 includes e.g. $In_{0.05}Ga_{0.95}N$ (the In concentration can be appropriately varied in the range of 4% or more and 10% or less).

As described above, the light (emission light) emitted from the light emitting unit 140 is e.g. near ultraviolet light. The peak wavelength of the emission light is e.g. 380 nm or more and 400 nm or less. However, the embodiment is not limited thereto. The wavelength of the emission light is arbitrary, and can be widely varied as described above.

In the case where the emission wavelength is 390 nm or more and 400 nm or less, the thickness of the well layer 42 is set to 5.5 nm or more. Then, the light emission efficiency is increased. More advantageously, this suppresses the decrease of efficiency associated with the increase of optical output, and the decrease of efficiency associated with the increase of operating temperature.

To form a deep potential for generating ultraviolet light emission with high efficiency at an emission wavelength of 380 nm or more and 400 nm or less, the Al composition in the first barrier layer BL1 and the i-th barrier layer BLi ($1 \leq i \leq n+1$) is set to 6% or more.

The thickness of the (n+1)-th barrier layer BL(n+1) (the barrier layer 41 nearest to the second layer 151 of p-type AlGaN) is set to 2 nm or more. If the thickness of the (n+1)-th barrier layer BL(n+1) is thinner than 2 nm, then in the process for increasing the growth temperature to grow the p-type AlGaN layer, the well layers 42 such as the n-th well layer WLn undergo thermal degradation. To control the characteristics of the well layer 42 including the influence of impurity diffusion, the thickness of the (n+1)-th barrier layer BL(n+1) is set to 4.5 nm or more. In particular, if the thickness of the (n+1)-th barrier layer BL(n+1) is thicker than the thickness of the well layer 42, there is a significant effect of relaxing the influence of the strain between the AlGaN layer and the well layer 42. If the (n+1)-th barrier layer BL(n+1) is too thick, this causes the increase of device resistance. Furthermore, if the (n+1)-th barrier layer BL(n+1) is too thick, carriers overflowing the well layer 42 are accumulated and cause absorption. To reduce this influence, the (n+1)-th barrier layer BL(n+1) is preferably made thinner than the first barrier layer BL1. In a semiconductor light emitting device with the thickness of the second barrier layer BL2 set to 9 nm or less, the device was successfully operated with a voltage increase of 10% or less of the operating voltage anticipated from the emission wavelength.

The thickness of the first barrier layer BL1 can be set to a value in the range of e.g. 4.5 nm or more and 30 nm or less. If the thickness of the first barrier layer BL1 is set to 4.5 nm or more, a semiconductor light emitting device with high efficiency is achieved. It is considered that if the thickness of the first barrier layer BL1 is set to 4.5 nm or more, the intrinsic material properties are sufficiently developed, and the effect of suppressing hole overflow is achieved. Furthermore, in the case where the thickness of the first barrier layer BL1 is 30 nm or less, high quality crystal growth can be performed relatively easily.

The thickness of the first to n-th barrier layers BL1-BLn is preferably thicker than that of the well layer 42. By setting the thickness of the first barrier layer BL1 to be thicker than the thickness of the well layer 42, carrier supply to the well layer 42 is effectively controlled. In particular, the thickness of the first to n-th barrier layers BL1-BLn is preferably twice or more the thickness of the well layer 42. Setting the thickness of the first to n-th barrier layers BL1-BLn to twice or more the thickness of the well layer 42 enables carrier supply to both sides of the first to (n−1)-th barrier layers BL1-BL(n−1). This improves the accuracy of carrier supply to the well layer 42.

To efficiently inject holes from the second layer 151 of p-type AlGaN into the n-th well layer WLn, the thickness of the (n+1)-th barrier layer BL(n+1) is preferably thin except for the above condition. Thus, the thickness of the barrier layer BL(n+1) may be thinner than the third layer 203 of the first stacked structure 210 and the fifth layer 205 of the second stacked structure 220.

The first barrier layer BL1 has the function of e.g. preventing holes injected into each well layer 42 of the light emitting unit 140 from flowing out to the first layer 131 side. To achieve the effect of potential block against carriers, particularly including the case where there are crystal defects and the like, the thickness of the first barrier layer BL1 is set sufficiently thick. A thickness of 15-20 nm achieves a sufficient effect. When the thickness was smaller than 13 nm, an increase was sometimes observed in the proportion of devices with large efficiency decrease at high density of injection current. When the thickness was thicker than 22 nm, an increase was sometimes observed in some proportion of devices with high resistance.

The third layer 203 of the first stacked structure 210 and the fifth layer 205 of the second stacked structure 220 are located on the opposite side of the first barrier layer BL1 from the well layer 42. Hence, the third layer 203 and the fifth layer 205 play a less significant role than the first barrier layer BL1 in suppressing the leakage of holes from the light emitting unit 140. On the other hand, these layers are provided in a plurality, and hence are likely to act as resistance of current. Thus, to decrease the driving voltage of the device, the third layer 203 and the fifth layer 205 are preferably thin. Hence, the thickness of the third layer 203 and the fifth layer 205 is preferably thinner than that of the first barrier layer BL1.

The thickness of the third layer 203 and the fifth layer 205 is preferably thin to reduce electrical resistance. Thus, the bandgap energy of the first barrier layer BL1 is made larger than that of these layers to increase the electrical resistance of the first barrier layer BL1. The relationship in thickness among the barrier layer 41, the third layer 203, and the fifth layer 205 can be treated as the relationship in effective thickness in terms of electrical resistance. At least the first barrier layer BL1 is set effectively thicker than the third layer 203 and the fifth layer 205. This improves the device characteristics.

As described above, the first barrier layer BL1 can be doped with Si at high concentration to reduce the influence of the piezoelectric field applied to the well layer 42. Thus, light emission with high efficiency can be achieved.

With regard to the relationship among the well layer 42 of the light emitting unit 140, the GaInN layer of the fourth layer 204 of the first stacked structure 210, and the GaInN layer of the sixth layer 206 of the second stacked structure 220, the thickness of these GaInN layers is preferably thinner than the thickness of the well layer 42. Then, for instance, the optical bandgap energy of the well layer 42 can be made smaller than the optical bandgap energy of GaInN of the fourth layer 204 and GaInN of the sixth layer 206. This can suppress that the light emission of the well layer 42 is absorbed by GaInN of the fourth layer 204 and GaInN of the sixth layer 206.

The relationship among the thickness of the well layer 42 of the light emitting unit 140, the thickness of GaInN of the fourth layer 204, and the thickness of GaInN of the sixth layer 206 can be specified by effective thickness in terms of each optical bandgap energy. The effective thickness of GaInN of the fourth layer 204 and the effective thickness of GaInN of the sixth layer 206 are preferably thinner than the effective thickness of the well layer 42. In a thin film structure, the bandgap energy can be significantly varied simply by varying the composition to fabricate a crystal in which the bandgap energy of the thinner layer is smaller than the bandgap energy of the thicker layer. However, this causes a large difference in the In concentration of GaInN, and causes a large difference in material properties. Thus, high quality crystal growth is difficult in this case. Hence, the thickness of GaInN of the fourth layer 204 and the thickness of GaInN of the sixth layer 206 are preferably thinner than the thickness of the well layer 42.

If the Al concentration in the first barrier layer BL1 and the i-th barrier layer BLi ($1 \leq i \leq n+1$) exceeds 10%, the crystal quality is degraded. By doping the first barrier layer BL1 and the i-th barrier layer BLi with a small amount of In, the crystal quality is improved. If the In concentration in the first barrier layer BL1 and the i-th barrier layer BLi is 0.3% or more, the crystal quality is improved. However, if the In concentration exceeds 1.0%, the crystal quality is degraded, and the light emission efficiency is decreased. However, in the case where the thickness is thin, the In concentration can be increased to 2%.

For instance, in the embodiment, in the case where the thickness of the first barrier layer BL1 is 20 nm or more, the maximum of the In concentration is approximately 1%. If the first barrier layer BL1 is thinned to 7 nm, then even if the In concentration is set to 2%, the crystal is not degraded, and intense light emission is achieved.

An example technique for growing the first barrier layer BL1 is now described.

It is difficult to grow a layer of quaternary mixed crystal AlGaInN with high crystal quality. Furthermore, the crystal doped with Si at high concentration is prone to degradation. By investigating the LED device structure and optimizing the growth condition, the present inventors have successfully increased the In concentration of the barrier layer BL1 made of AlGaInN without degrading the crystal quality.

For instance, as described above, in the embodiment, if the thickness of the first barrier layer BL1 exceeds 20 nm, the In concentration is limited up to approximately 1%. However, if the first barrier layer BL1 is thinned to 7 nm, then even if the In concentration is set to 2%, the crystal is not degraded, and intense light emission is achieved.

The increase of In concentration improves the steepness of the interface with the well layer 42 made of GaInN and improves the crystallinity of the well layer 42. As a result, the first barrier layer BL1 made of AlGaInN can be doped with Si at high concentration.

Furthermore, by thinning the thickness of the first barrier layer BL1 having high Si concentration, the first barrier layer BL1 can be doped with Si at higher concentration.

The Al concentration of the first barrier layer BL1 may be higher than that of the second barrier layer BL2. This increases the bandgap of the first barrier layer BL1. Thus, the confinement effect for holes is increased. This reduces leakage of current at the time of increasing the injection current, and can increase the optical output. For electrons, the second layer 151 (p-type AlGaN layer) serves as a barrier. Thus, the Al concentration of the second barrier layer BL2 is set sufficiently lower than that of the second layer 151.

For instance, the Al concentration of the first barrier layer BL1 can be set to 8% or more, and the Al concentration of the second barrier layer BL2 can be set to 7%. In this case, the first barrier layer BL1 is grown at high temperature. Then, by decreasing the temperature to a lower growth temperature, the well layer 42 and the second barrier layer BL2 may be grown. Thus, by growing the first barrier layer BL1 having high Al concentration at high temperature, the first barrier layer BL1 can be grown as a high quality crystal. The well layer 42 and the second barrier layer BL2 having low Al concentration are grown at low temperature. Thus, for instance, the well layer with high In concentration can be grown with good characteristics.

Here, after the second barrier layer BL2 is grown to a thickness for protecting the surface of the well layer 42, the rest of the second barrier layer BL2 may be grown at increased temperature.

For instance, in the embodiment, the first barrier layer BL1 may be formed in a two-layer structure by combining an AlGaN layer having high Al concentration and an AlGaInN layer having low Al concentration. In such a structure, the AlGaN layer having high Al concentration can suppress overflow of holes, and the AlGaInN layer having low Al concentration can improve the characteristics of the crystal surface. Thus, the well layer 42 can be formed on the crystal surface with improved characteristics. In this case, the AlGaN layer and part of the AlGaInN layer may be grown at high temperature, and the rest of the AlGaInN layer may be grown at the same temperature as the well layer 42. By such a method, a high quality AlGaN crystal can be grown at high temperature, and the well layer 42 can be grown at a temperature suitable for the well layer 42.

The increase of efficiency by the configuration including the first stacked structure 210 and the second stacked structure 220 as described above is achieved particularly effectively in the configuration of providing a plurality of well layers 42.

Furthermore, in the case of providing a plurality of well layers 42, the configuration of the first barrier layer BL1 can be made different from the configuration of the other barrier layers 41 (e.g., second barrier layer BL2 to (n+1)-th barrier layer BL(n+1)). Then, higher efficiency can be achieved.

Figure 6A:
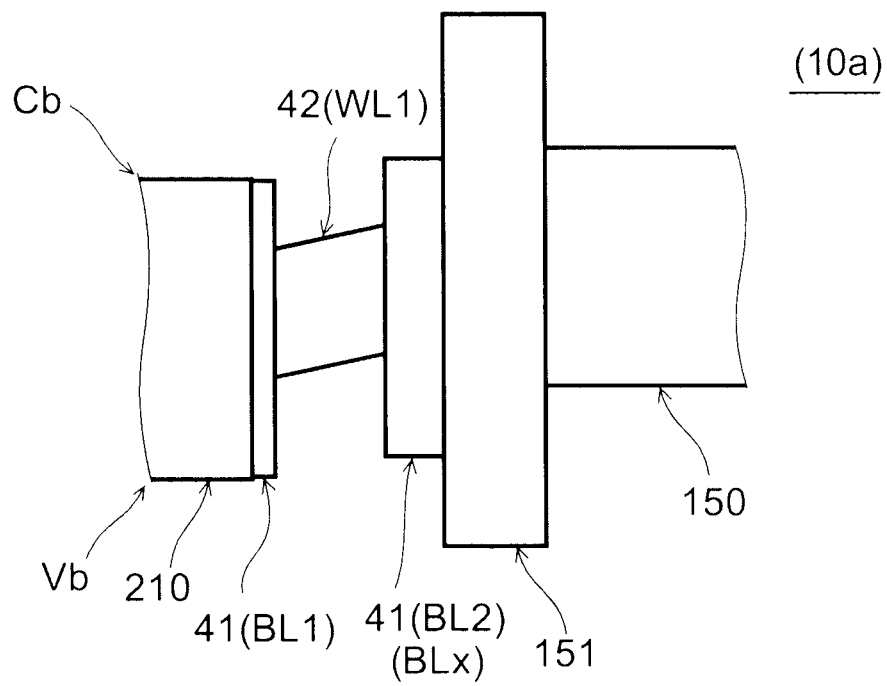
FIGS. 6A and 6B are bandgap energy diagrams illustrating semiconductor light emitting devices according to the first embodiment.
Figure 6B:
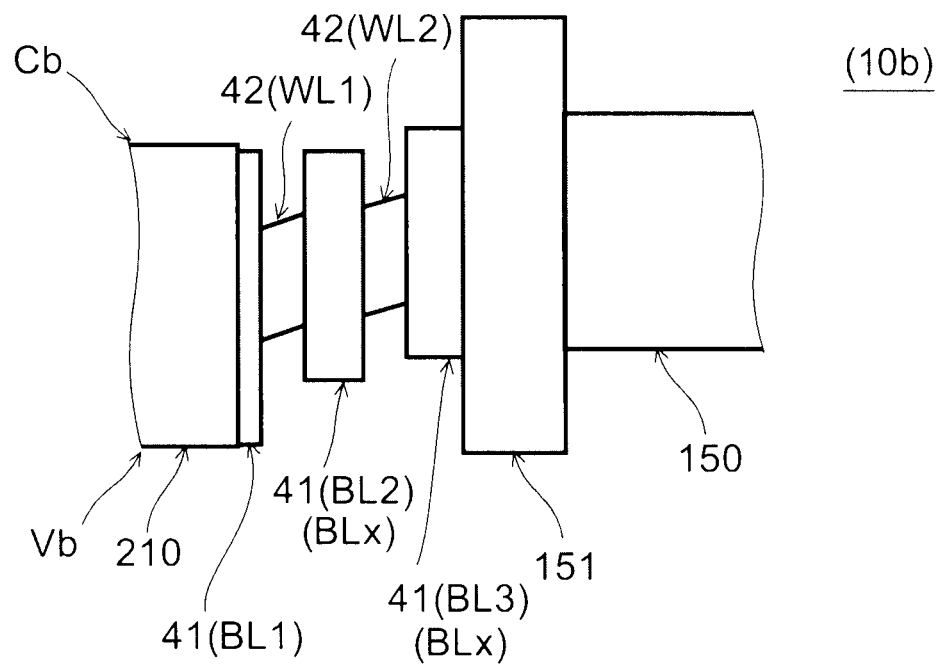

FIGS. 6A and 6B are bandgap energy diagrams illustrating the configuration of semiconductor light emitting devices according to the first embodiment.

More specifically, FIG. 6A shows an example of the semiconductor light emitting device 10a including an SQW structure. FIG. 6B shows an example of the semiconductor light emitting device 10b including two well layers 42 as an example including an MQW structure. These figures illustrate the valence band Vb and the conduction band Cb for electrons.

As shown in FIG. 6A, in the case of the SQW structure, the bandgap energy of the first barrier layer BL1 on the first stacked structure 210 side (n-type layer side) may be made substantially equal to the bandgap energy of the second barrier layer BL2 on the second layer 151 side (p-type layer side). That is, the first barrier layer BL1 and the second barrier layer BL2 can be made of e.g. AlGaInN.

As shown in FIG. 6B, of the plurality of barrier layers 41, the barrier layer 41 nearest to the first stacked structure 210 is the first barrier layer BL1. The bandgap energy in the first barrier layer BL1 is larger than the bandgap energy in the other barrier layers 41 except the first barrier layer BL1 of the plurality of barrier layers 41 (second barrier layer BL2 to (n+1)-th barrier layer BL(n+1) (n is an integer of 1 or more)).

In particular, the bandgap energy of the first barrier layer BL1 is larger than the bandgap energy of the barrier layer 41 (in this example, the second barrier layer BL2) sandwiched between a plurality of well layers 42.

For instance, the barrier layer 41 (first barrier layer BL1) nearest to the first stacked structure 210 is made of AlGaInN. The other barrier layers 41 except the first barrier layer BL1 are made of GaN or GaInN. In particular, the barrier layer 41 (in this example, the second barrier layer BL2) sandwiched between two well layers 42 is made of GaInN.

Thus, holes are uniformly injected into the two well layers 42 via the barrier layer 41 (in this example, the second barrier layer BL2) sandwiched between two well layers 42. Furthermore, this can suppress strain which is more likely to occur in the case where the barrier layer 41 (first barrier layer BL1) nearest to the first stacked structure 210 is made of AlGaInN.

Thus, the bandgap energy in the first barrier layer BL1 is set larger than the bandgap energy in the other barrier layers 41 except the first barrier layer BL1. Hence, the effect of increasing the efficiency by the first stacked structure 210 and the second stacked structure 220 is achieved more effectively.

Figure 7:
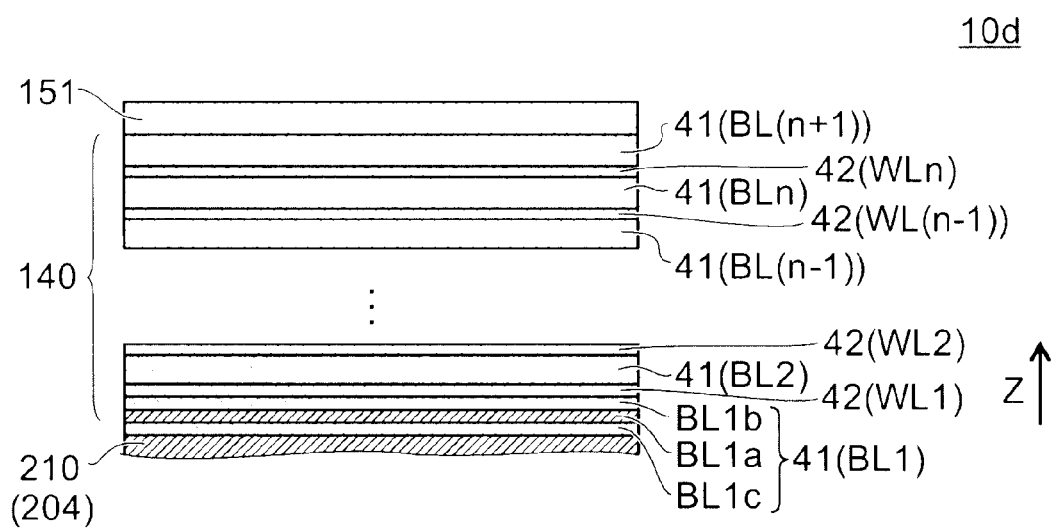
FIG. 7 is a schematic sectional view illustrating an alternative semiconductor light emitting device according to the first embodiment.

FIG. 7 is a schematic sectional view illustrating the configuration of an alternative semiconductor light emitting device according to the first embodiment.

As shown in FIG. 7, in the alternative semiconductor light emitting device 10d according to the embodiment, the first barrier layer BL1 has a three-layer structure. The rest of the configuration can be made similar to that of the semiconductor light emitting device 10, and hence the description thereof is omitted.

The first barrier layer BL1 includes a first sublayer BL1a provided between the first layer 131 and the well layer 42 (between the first stacked structure 210 and the well layer 42), a second sublayer BL1b provided between the first sublayer BL1a and the well layer 42, and a third sublayer BL1c provided between the first sublayer BL1a and the first layer 131 (between the first sublayer BL1a and the first stacked structure 210).

The first sublayer BL1a can be an AlGaN layer having high Al concentration. The second sublayer BL1b can be an AlGaInN layer having low Al concentration. The Al concentration in the second sublayer BL1b is lower than that in the first sublayer BL1a. The third sublayer BL1c can be an AlGaInN layer having low Al concentration. The Al concentration in the third sublayer BL1c is lower than that in the first sublayer BL1a.

The Al concentration in the first sublayer BL1a is set to e.g. 15%. The thickness of the first sublayer BL1a is set to e.g. 5 nm.

The Al concentration in the second sublayer BL1b is set to e.g. 7%. The thickness of the second sublayer BL1b is set to e.g. 5 nm.

The Al concentration in the third sublayer BL1c is set equal to e.g. the Al concentration in the third layer 203 of the first stacked structure 210. The thickness of the third sublayer BL1c is set to e.g. 2 nm.

Alternatively, the Al concentration in the first sublayer BL1a is set to e.g. 10% or more and 26% or less. The thickness of the first sublayer BL1a is set to e.g. 5 nm or more and 50 nm or less. The first sublayer BL1a may be doped with Si as n-type impurity at $5 \times 10^{17}$ cm$^{-3}$ or more and $1 \times 10^{19}$ cm$^{-3}$ or less.

The Al concentration in the second sublayer BL1b is set to e.g. 6% or more and 10% or less. The In concentration in the second sublayer BL1b is set to e.g. 0.3% or more and 1% or less. The thickness of the second sublayer BL1b is set to e.g. 3 nm or more and 15 nm or less. The second sublayer BL1b is provided as necessary. The second sublayer BL1b may be omitted as the case may be.

By providing the first sublayer BL1a thus configured, the effect of suppressing hole overflow is achieved. Thus, in the semiconductor light emitting device, the effect of improving the optical output is achieved at the time of high current operation. Furthermore, the decrease of optical output at the time of increasing the operating temperature is suppressed.

Furthermore, the second sublayer BL1b thus provided enables improvement of the characteristics of the crystal surface and formation of the well layer 42 on the crystal surface with improved characteristics. Thus, in particular, formation of nonradiative centers is suppressed. Hence, when the semiconductor light emitting device is operated, there is a significant effect of increasing the light emission efficiency in the low current region. If the second sublayer BL1b is doped with n-type impurity, the nonradiative center is screened. Thus, the light emission efficiency in the low current region can be improved.

In the case where the second sublayer BL1b is not provided, the well layer 42 can be made close to the AlGaN layer (first sublayer BL1a) having a large bandgap. Thus, the carrier concentration in the well layer 42 can be increased. Hence, the light emission efficiency can be increased. The decrease of light emission efficiency is limited particularly at high output. Thus, it is possible to realize a semiconductor light emitting device operated with high light emission efficiency even in high current operation at high temperature.

The third sublayer BL1c covers the surface of the fourth layer 204 to function as a protective layer for growing the first sublayer BL1a with high quality. The third sublayer BL1c is provided as necessary. The third sublayer BL1c may be omitted as the case may be.

For instance, the third sublayer BL1c is grown at 850° C., the same temperature as the third layer 203. Then, the growth temperature is increased to 1040° C. to grow a first sublayer BL1a. Then, the growth temperature is decreased to grow a second sublayer BL1b and a well layer 42. Thus, a semiconductor light emitting device is achieved in which the hole overflow is small, the light emission efficiency of the well layer 42 is high, and the optical output is high from low current to high current.

Figure 8:
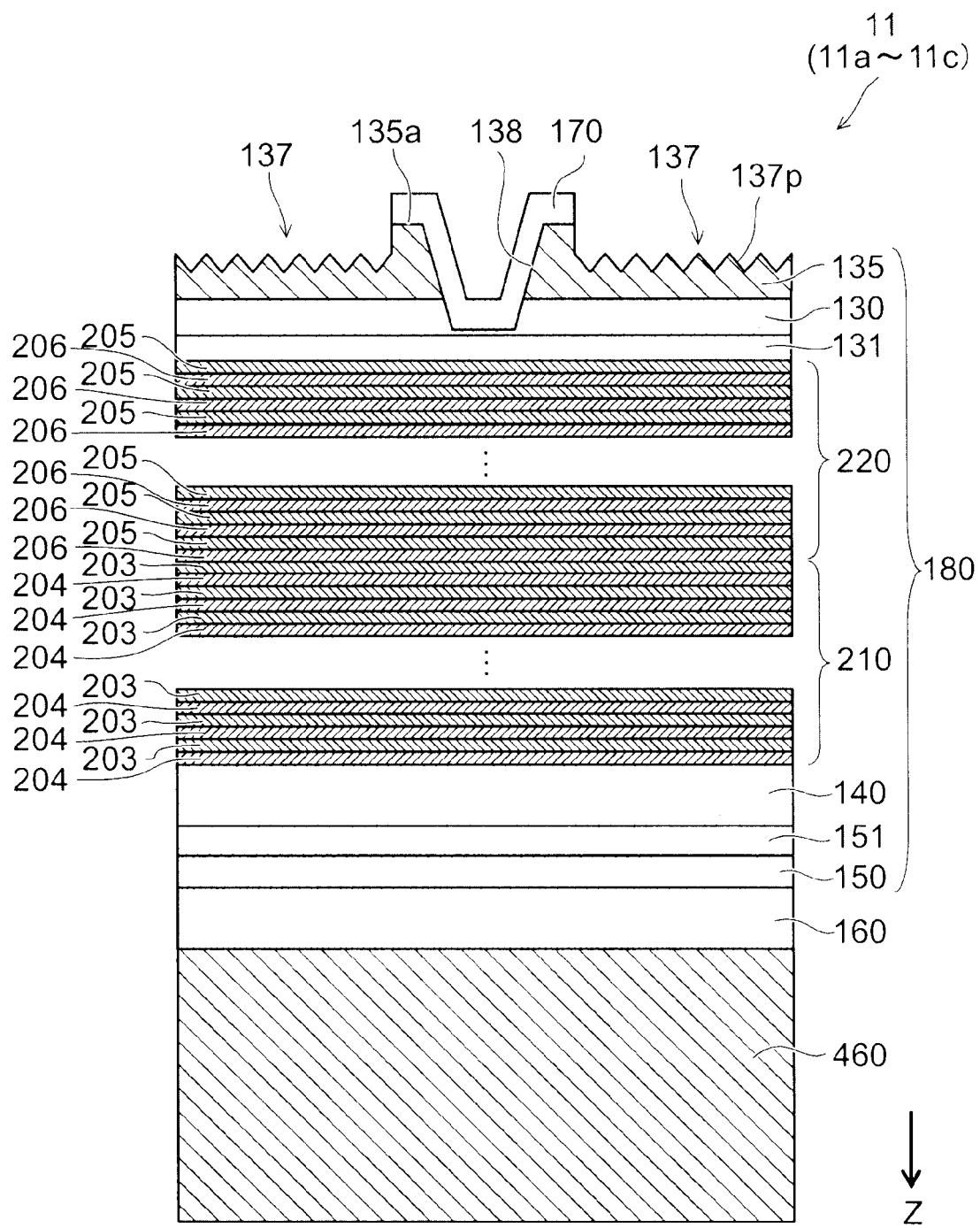
FIG. 8 is a schematic sectional view illustrating an alternative semiconductor light emitting device according to the first embodiment.

FIG. 8 is a schematic sectional view illustrating the configuration of an alternative semiconductor light emitting device according to the first embodiment.

As shown in FIG. 8, in the alternative semiconductor light emitting device 11 (and semiconductor light emitting devices 11a-11c) according to the embodiment, a first layer 131, a light emitting unit 140, and a second layer 151 are provided on a conductive substrate 460. The conductive substrate 460 is made of e.g. Ge. The light emitting unit 140 in the semiconductor light emitting devices 11, 11a-11c can be configured as illustrated in FIGS. 2A to 2D.

Specifically, a p-type contact layer 150 is provided between the conductive substrate 460 and the second layer 151. A p-side electrode 160 is provided between the conductive substrate 460 and the p-type contact layer 150. The p-side electrode 160 is reflective to the light emitted from the light emitting unit 140.

Figure 9:
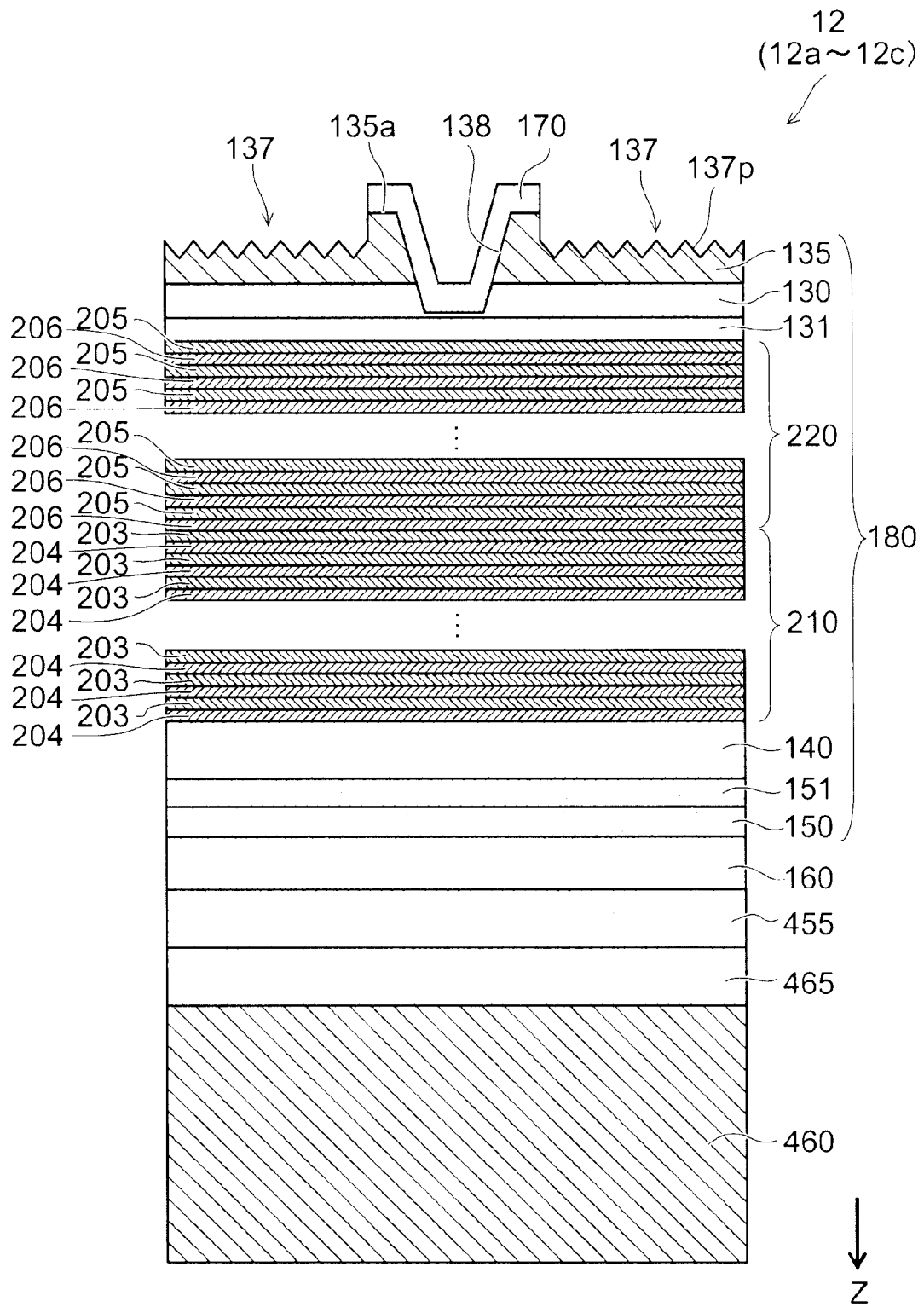
FIG. 9 is a schematic sectional view illustrating an alternative semiconductor light emitting device according to the first embodiment.

FIG. 9 is a schematic sectional view illustrating the configuration of an alternative semiconductor light emitting device according to the first embodiment.

As shown in FIG. 9, in the alternative semiconductor light emitting device 12 (and semiconductor light emitting devices 12a-12c) according to the embodiment, a first metal layer 455 is provided between a conductive substrate 460 and the p-side electrode 160. A second metal layer 465 is provided between the conductive substrate 460 and the first metal layer 455.

In the semiconductor light emitting device 11 (11a-11c) illustrated in FIG. 8 and the semiconductor light emitting device 12 (12a-12c) illustrated in FIG. 9, an n-type contact layer 130 is provided on the opposite side of the first layer 131 from the light emitting unit 140. A low impurity concentration semiconductor layer 135 is provided on the opposite side of the n-type contact layer 130 from the first layer 131.

The impurity concentration in the low impurity concentration semiconductor layer 135 is lower than the impurity concentration in the n-type contact layer 130. The low impurity concentration semiconductor layer 135 can be e.g. a non-doped GaN layer. The low impurity concentration semiconductor layer 135 can be the second buffer layer 122 (lattice relaxation layer) described above.

The low impurity concentration semiconductor layer 135 may be formed in a two-layer structure. More specifically, an n-type low impurity concentration layer (not shown) is provided between the second buffer layer 122 and the n-type contact layer 130. The second buffer layer 122 and this n-type low impurity concentration layer may be used as the low impurity concentration semiconductor layer 135. In such configuration, on the second buffer layer 122, the above n-type low impurity concentration layer is grown. The n-type low impurity concentration layer has low n-type impurity concentration. Hence, high quality crystal growth of the n-type low impurity concentration layer is easy. After this growth, the n-type contact layer 130 can be grown. The n-type contact layer 130 has high impurity concentration. Hence, crystal growth of the n-type contact layer 130 is difficult. However, the n-type contact layer 130 can thus be grown on the high quality base crystal. Hence, the n-type contact layer 130 with high quality can be grown.

The low impurity concentration semiconductor layer 135 is provided with an opening 138. The opening 138 exposes part of the n-type contact layer 130. From the major surface 135a of the low impurity concentration semiconductor layer 135 on the opposite side from the n-type contact layer 130, the opening 138 extends to the n-type contact layer 130. That is, the bottom of the opening 138 extends to the n-type contact layer 130.

The n-side electrode 170 is provided so as to cover the n-type contact layer 130 exposed in the opening 138 and part of the low impurity concentration semiconductor layer 135.

The major surface 135a of the low impurity concentration semiconductor layer 135 not covered with the n-side electrode 170 is provided with a rough surface portion 137 including an unevenness 137p.

The semiconductor light emitting device 11 (11a-11c, 12, 12a-12c) is fabricated by e.g. the following method.

For instance, on a substrate 110 made of sapphire, crystal layers of a first buffer layer 121, a second buffer layer 122 (constituting a low impurity concentration semiconductor layer 135), an n-type contact layer 130, a first layer 131 (n-type confinement layer), a second stacked structure 220, a first stacked structure 210, a light emitting unit 140, a second layer 151 (p-type confinement layer), and a p-type contact layer 150 are formed to form a crystal stacked body 180.

Then, the method performs the step for forming a p-side electrode 160 on the crystal stacked body 180, the step for bonding the crystal stacked body 180 to a conductive substrate 460, the step for removing the substrate 110 and the first buffer layer 121, and the step for forming an n-side electrode 170 on the exposed crystal layer (n-type contact layer 130) and forming a rough surface portion 137 (i.e., unevenness 137p) on the low impurity concentration semiconductor layer 135.

First, examples of the crystal layers on the substrate 110 made of sapphire are described.

For instance, by using the metal organic chemical vapor deposition method, on a substrate 110 with the surface made of a sapphire c-plane, a first buffer layer 121 including AlN (a thickness of e.g. 2 μm) is formed. Then, a non-doped GaN layer (a thickness of e.g. 2 μm) is formed as a second buffer layer 122.

The first buffer layer 121 may be e.g. an $Al_{\alpha 2}Ga_{1-\alpha 2}N$ layer ($0.8 \leq \alpha 2 \leq 1$). In this case, the wafer warpage can be compensated by adjusting the Al concentration.

Then, a Si-doped n-type GaN layer (a Si concentration of e.g. $1 \times 10^{18}$ $cm^{-3}$ or more and $1 \times 10^{20}$ $cm^{-3}$ or less and a thickness of e.g. 6 μm) is formed as an n-type contact layer 130. Furthermore, a Si-doped n-type GaN layer (a thickness of e.g. 0.5 μm) is formed as a first layer 131.

Subsequently, a second stacked structure 220 and a first stacked structure 210 are formed. Then, a light emitting unit 140 is formed. For instance, a Si-doped n-type $Al_{0.07}Ga_{0.925}In_{0.005}N$ layer (a Si concentration of e.g. $1.0 \times 10^{19}$ $cm^{-3}$ or more and $1.5 \times 10^{19}$ $cm^{-3}$ or less) is formed as a first barrier layer BL1. Furthermore, a GaInN layer (a wavelength of e.g. 380 nm or more and 470 nm or less) is formed as a well layer 42. Furthermore, an $Al_{0.07}Ga_{0.925}In_{0.005}N$ layer (a Si concentration of e.g. $1.0 \times 10^{18}$ $cm^{-3}$ or less, where Si doping may be omitted) is formed as a second barrier layer BL2.

Furthermore, a Mg-doped p-type $Al_{0.22}Ga_{0.78}N$ layer (a Mg concentration of e.g. $1.0 \times 10^{19}$ $cm^{-3}$ and a thickness of e.g. 0.02 μm) is formed as a second layer 151. Furthermore, a Mg-doped p-type GaN layer (a thickness of e.g. 0.28 μm) is formed as a p-type contact layer 150.

For instance, by setting the Mg concentration of the p-type contact layer 150 to be relatively high, such as $1 \times 10^{20}$ $cm^{-3}$ or more and less than $1 \times 10^{21}$ $cm^{-3}$, the ohmic contact with the p-side electrode 160 can be improved. However, in the case of a semiconductor light emitting diode, unlike a semiconductor laser diode, the distance between the contact layer and the well layer is short. Hence, there is concern about characteristics degradation due to Mg diffusion. Here, the contact area between the p-side electrode 160 and the p-type contact layer 150 is large, and thus the current density during operation is low. By taking advantage of this, the Mg concentration in the p-type contact layer 150 can be suppressed to approximately $1 \times 10^{19}$ $cm^{-3}$ or more and less than $1 \times 10^{20}$ $cm^{-3}$ without significantly compromising the electrical characteristics. This can prevent Mg diffusion and improve the light emission characteristics.

Next, an example of forming a p-side electrode 160 on the crystal stacked body 180, bonding the crystal stacked body 180 to a conductive substrate 460, and removing the substrate 110 and the first buffer layer 121 is described.

First, to form a p-side electrode 160, a vacuum evaporation apparatus is used to continuously form e.g. an Ag film (a thickness of e.g. 200 nm) and a Pt film (a thickness of e.g. 2 nm). After lift-off, for instance, sintering is performed in an oxygen atmosphere at 400° C. for 1 min (minute).

Then, on the p-side electrode 160, for instance, a stacked film of Ni film and Au film is formed as a first metal layer 455 with a thickness of 1000 nm.

In this example, on a conductive substrate 460 made of e.g. Ge, a second metal layer 465 (e.g., AuSn solder with a thickness of 3 μm) is formed. The second metal layer 465 formed on the conductive substrate 460 and the first metal layer 455 formed on the crystal stacked body 180 are opposed to each other and heated to a temperature higher than or equal to the eutectic point of AuSn. The heating temperature is e.g. 300° C. Thus, the conductive substrate 460 and the crystal stacked body 180 are bonded.

Then, from the side of the substrate 110 made of sapphire, for instance, third harmonic (355 nm) or fourth harmonic (266 nm) laser light of a YVO$_4$ solid-state laser is applied. The laser light has a wavelength shorter than the forbidden band wavelength based on the forbidden band width of GaN of the second buffer layer 122 (GaN layer such as the above non-doped GaN buffer layer). That is, the laser light has energy higher than the forbidden band width of GaN.

This laser light is efficiently absorbed in the region on the first buffer layer 121 (single crystal AlN buffer layer) side of the second buffer layer 122 (non-doped GaN buffer layer). Thus, GaN on the first buffer layer 121 (single crystal AlN buffer layer) side of the second buffer layer 122 (GaN buffer layer) is decomposed by generated heat.

Here, in the case where the first buffer layer 121 is made of $Al_{\alpha2}Ga_{1-\alpha2}N$ (0.8≤α2≤1), the wafer warpage can be compensated by adjusting the Al concentration.

In the case of using such a laser lift-off method, the temperature of GaN is rapidly increased. This causes rapid thermal expansion and thermal contraction. If the first buffer layer 121 is made of AlN, the thermal conductivity is high, and hence the heat rapidly spreads. Thus, the influence of local thermal expansion and contraction can be relaxed.

On the other hand, in the case where the first buffer layer 121 is made of AlGaN, the thermal conductivity is sharply decreased simply by doping with a slight amount of Ga. This can suppress the spread of the influence of temperature change due to laser light. Hence, this is suitable for locally and rapidly changing the temperature. Thus, the laser light power can be decreased. This can suppress that the damage due to laser light spreads throughout the wafer.

Then, by e.g. hydrochloric acid treatment, the decomposed GaN is removed. Thus, the substrate 110 made of sapphire is stripped and separated from the crystal stacked body 180.

Next, an example of forming an n-side electrode 170 on the exposed crystal layer (n-type contact layer 130) and forming an unevenness 137p on the low impurity concentration semiconductor layer 135 is described.

Part of the second buffer layer 122 (non-doped GaN layer) separated from the substrate 110 made of sapphire is removed to form an opening 138. This opening 138 exposes part of the n-type contact layer 130 (n-type GaN layer, i.e., the above Si-doped n-type GaN layer). Here, to prevent step disconnection in the n-side electrode 170, the side surface of the opening 138 is preferably processed into a tapered shape. For instance, by dry etching with chlorine gas using a resist mask, a recess having a tapered shape of 50° can be formed as an opening 138. A stacked film of e.g. Ti/Pt/Au is formed by e.g. the lift-off method with a thickness of e.g. 500 nm so as to cover the n-type contact layer 130 (Si-doped n-type GaN layer) exposed from the opening 138 and part of the second buffer layer 122 (non-doped GaN layer). The stacked film is patterned to form an n-side electrode 170.

Subsequently, the surface of the second buffer layer 122 (non-doped GaN layer) not provided with the n-side electrode 170 is processed by e.g. alkaline etching with KOH solution to form an unevenness 137p. The condition used for KOH solution treatment is such that, for instance, a 1-mol/L solution of KOH is heated to 80° C. to perform etching for 20 min. Thus, the unevenness 137p is formed.

Next, the conductive substrate 460 is cut by e.g. cleavage or diamond blade cutting into individual devices. Thus, the semiconductor light emitting device 11 (11a-11c, 12, 12a-12c) according to the embodiment is fabricated.

In the foregoing, the size of the unevenness 137p is set larger than e.g. the wavelength of emission light emitted from the light emitting unit 140. Specifically, the size of the unevenness 137p is set larger than e.g. the wavelength in the low impurity concentration semiconductor layer 135 of emission light emitted from the light emitting unit 140. Thus, the optical path is changed in the rough surface portion 137 provided with the unevenness 137p. This increases the light extraction efficiency. Thus, a semiconductor light emitting device having higher efficiency is achieved.

Thus, in the semiconductor light emitting device 11 (11a-11c, 12, 12a-12c) according to the embodiment, the major surface of the substrate 110 is the c-plane of a sapphire layer. On the substrate 110, a GaN layer is grown via a single crystal buffer layer including $Al_{x3}Ga_{1-x3}N$ (0.8≤x3≤1). The first layer 131 is provided on the GaN layer. Alternatively, on a substrate 110 of silicon (silicon substrate), a GaN layer is grown via a buffer layer including $Al_{x3}Ga_{1-x3}N$ (0.8≤x3≤1). The first layer 131 is provided on the GaN layer.

This single crystal buffer layer can be e.g. the first buffer layer 121. That is, this single crystal buffer layer is made of a first AlN buffer layer 121a of high carbon concentration and a second AlN buffer layer 121b of high purity formed on the first AlN buffer layer 121a.

The above GaN layer grown via the single crystal buffer layer can be e.g. the second buffer layer 122, the n-type contact layer 130, and a Si-doped n-type confinement layer.

Thus, by growing a GaN layer via the above single crystal buffer layer on the substrate 110, a GaN layer with high crystal quality is achieved.

The conductive substrate 460 is made of e.g. a semiconductor substrate of e.g. Si or Ge, and a metal plate of e.g. Cu or CuW. The conductive substrate 460 only needs to be conductive in at least a portion thereof. The conductive substrate 460 can be e.g. a resin plate including metal wirings. The conductive substrate 460 can be a base member made of a material being conductive in at least a portion thereof.

The p-side electrode 160 includes e.g. silver or silver alloy. A single layer film of metal other than silver has substantial reflection efficiency in the visible band. However, the reflection efficiency of a single layer film of metal other than silver tends to decrease with the decrease of wavelength in the ultraviolet region of 420 nm or less. In contrast, silver has high reflection efficiency characteristics also for light in the ultraviolet band of 370 nm or more and 410 nm or less. In the case of semiconductor light emitting devices for ultraviolet emission with the p-side electrode 160 made of a silver alloy, it is preferable that the portion of the p-side electrode 160 on the side of the interface with the semiconductor layer have a higher component ratio of silver. The thickness of the p-side electrode 160 is preferably 100 nm or more to ensure the light reflection efficiency.

A diffusion suppression layer may be provided on the p-side electrode 160. The diffusion suppression layer suppresses e.g. diffusion of solder into the p-side electrode 160, or reaction of solder with the material included in the p-side electrode 160. The diffusion suppression layer is made of a material not reacting with silver, or not actively diffusing into silver. This diffusion suppression layer is in electrical contact with the p-side electrode 160. The diffusion suppression layer can be made of a single layer film or a stacked film of high melting point metal such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), iridium (Ir), and platinum (Pt).

More preferably, the metal constituting the diffusion suppression layer has high work function so that some diffusion causes no problem, and the metal is likely to form ohmic contact with the p-type contact layer 150 (p-type GaN layer). This metal includes at least one of iron (Fe), cobalt (Co), nickel (Ni), rhodium (Rh), tungsten (W), rhenium (Re), iridium (Ir), and platinum (Pt).

In the case of a single layer film, the thickness of the diffusion suppression layer is preferably in the range of 5 nm or more and 200 nm or less so that the film state can be maintained. In the case of a stacked film, the thickness of the diffusion suppression layer can be set to a value in the range of e.g. 10 nm or more and 10000 nm or less.

In the semiconductor light emitting device 11 (11*a*-11*c*, 12, 12*a*-12*c*) according to the embodiment, a GaN layer is formed on the substrate 110 made of sapphire. The first layer 131 is formed on the GaN layer. The light emitting unit 140 is formed on the first layer 131. The second layer 151 is formed on the light emitting unit 140. Then, the substrate 110 is removed. In the semiconductor light emitting device 11 (11*a*-11*c*, 12, 12*a*-12*c*) thus configured, particularly high light emission efficiency can be achieved.

When the crystal stacked body 180 is bonded to the conductive substrate 460, and when the GaN layer is decomposed by laser light to strip the substrate 110 made of sapphire, the crystal layers of the crystal stacked body 180 are susceptible to crystal defects and damage.

It is considered that this results from e.g. the thermal expansion coefficient difference between the conductive substrate 460, sapphire, and the GaN layer, local heating, and products generated by decomposition of GaN. If crystal defects and damage occur in the crystal layer, Ag contained in the p-side electrode 160 diffuses through the crystal defects and damage. This results in accelerated increase of leaks and crystal defects inside the crystal.

In the embodiment, high crystallinity is achieved in the light emitting unit 140. Hence, a high quality crystal can be obtained even after the substrate 110 used for crystal growth is removed.

In the embodiment, the crystal quality is significantly improved by introducing the first stacked structure 210 and the second stacked structure 220. Hence, the embodiment effectively suppresses the characteristics degradation of the well layer 42 which may occur in removing the substrate 110.

In the semiconductor light emitting device having the structure obtained by removing the substrate 110, the decrease of light emission efficiency is likely to occur. The present inventors analyzed the cause of being prone to the decrease of light emission efficiency in this configuration. As a result, the present inventors have conjectured that the increase of dislocations in the crystal due to high strain applied from the substrate 110 side in the process of removing the substrate 110 significantly contributes to the decrease of light emission efficiency.

More specifically, in removing the substrate 110, if the substrate 110 is removed by heating, it is considered that dislocations having lateral components are introduced into the crystal in response to thermal expansion. Furthermore, when the substrate 110 is stripped, the stripped portion and the non-stripped portion are produced. Hence, the stripping proceeds with a force applied obliquely. Thus, it is conjectured that dislocations associated with the removal of the substrate 110 also have oblique components.

In the semiconductor light emitting device 11 (11*a*-11*c*, 12, 12*a*-12*c*), the first stacked structure 210 and the second stacked structure 220 are introduced between the substrate 110 and the light emitting unit 140. It is considered that this affects the change of the direction of dislocations (the change to the lateral and oblique direction) associated with the removal of the substrate 110. That is, it is presumed that in the embodiment, because the direction of dislocations is made close to perpendicular to the crystal surface, the effect of suppressing the change of the direction of dislocations is achieved. This suppresses the decrease of light emission efficiency which may occur in removing the substrate 110. Thus, a semiconductor light emitting device for emitting light with high efficiency can be realized.

In the embodiment, a GaN layer is formed on the substrate 110 made of sapphire. The first layer 131 is formed on the GaN layer. The light emitting unit 140 is formed on the first layer 131. Alternatively, the GaN layer is formed on a silicon substrate. The first layer 131 is formed on the GaN layer. The light emitting unit 140 is formed on the first layer 131. Furthermore, the second layer 151 is formed on the light emitting unit 140. Then, the above substrate is removed.

As described above, the first stacked structure 210 and the second stacked structure 220 can be applied to the semiconductor light emitting device based on the configuration in which the substrate 110 is removed. Then, in particular, high crystal quality can be maintained. This suppresses the characteristics degradation of the crystal associated with the removal of the substrate 110. Thus, light emission with particularly high efficiency can be realized. That is, the light emission efficiency can be increased particularly effectively by using the configuration obtained by removing the substrate 110 in combination with the first stacked structure 210 and the second stacked structure 220.

Second Embodiment

Figure 10:
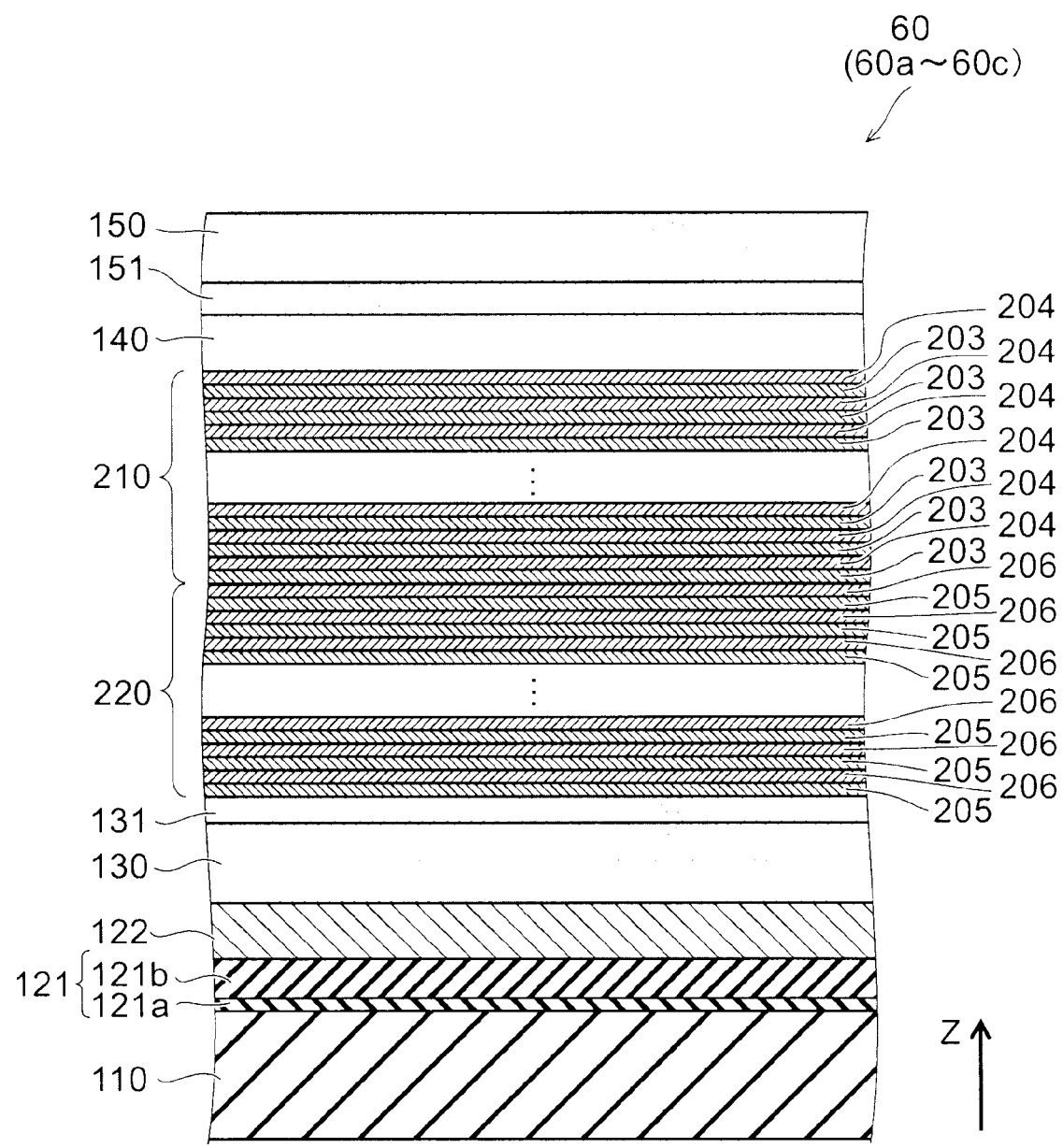
FIG. 10 is a schematic sectional view illustrating a wafer according to a second embodiment.

FIG. 10 is a schematic sectional view illustrating the configuration of a wafer according to a second embodiment.

As shown in FIG. 10, the wafer 60 (60*a*-60*c*) according to the embodiment includes a first layer 131 of n-type including a nitride semiconductor, a second layer 151 of p-type including a nitride semiconductor, a light emitting unit 140, a first stacked structure 210, and a second stacked structure 220. The light emitting unit 140 is provided between the first layer 131 and the second layer 151. The light emitting unit includes a plurality of barrier layers 41 and a well layer 42 provided between the plurality of barrier layers 41. The light emitting unit 140 in the wafers 60, 60*a*, 60*b*, and 60*c* has a configuration illustrated in FIGS. 2A, 2B, 2C, and 2D, respectively.

The first stacked structure 210 is provided between the first layer 131 and the light emitting unit 140. The first stacked structure 210 includes a plurality of third layers 203 including a nitride semiconductor, and a plurality of fourth layers 204 alternately stacked with the plurality of third layers 203 and including GaInN. The thickness of each fourth layer 204 is thinner than the thickness of the well layer 42.

The second stacked structure 220 is provided between the first layer 131 and the first stacked structure 210. The second stacked structure 220 includes a plurality of fifth layers 205 and a plurality of sixth layers 206 alternately stacked with the plurality of fifth layers 205 and including GaInN. The fifth layer 205 has a composition different from the composition of the third layer. The thickness of each sixth layer 206 is thinner than the thickness of the well layer 42.

The plurality of third layers 203 include one of AlGaInN and GaN, and the plurality of fifth layers 205 include the other of AlGaInN and GaN. For instance, the plurality of third layers 203 include AlGaInN, and the plurality of fifth layers 205 include GaN.

The thickness of each of the plurality of third layers 203 is thinner than the thickness of each of the plurality of barrier layers 41. The thickness of each of the plurality of fifth layers 205 is thinner than the thickness of each of the plurality of barrier layers 41.

The wafer 60 (60a-60c) can have similar characteristics to those of the semiconductor light emitting device according to the first embodiment. That is, the wafer 60 (60a-60c) can provide a wafer having high efficiency.

As shown in FIG. 10, the wafer 60 (60a-60c) can further include various layers described with reference to the first embodiment.

The well layer 42 has a thickness of e.g. 2.5 nm or more and 9 nm or less. The well layer 42 emits e.g. near ultraviolet light. The peak wavelength of the well layer 42 is e.g. 380 nm or more and 400 nm or less.

As in the above examples, the light (emission light) emitted from the light emitting unit 140 is not limited to this wavelength region, but the wavelength can be set to various values. The structure of the light emitting unit 140 can be based on various configurations described above.

In the case of providing a plurality of well layers 42, particularly high efficiency is achieved.

The sum of the total thickness of the plurality of fourth layers 204 and the thickness of the well layer 42 can be set to 25 nm or more and 45 nm or less.

Third Embodiment

The embodiment relates to a method for manufacturing e.g. the semiconductor light emitting device described with reference to the first embodiment.

Figure 11:
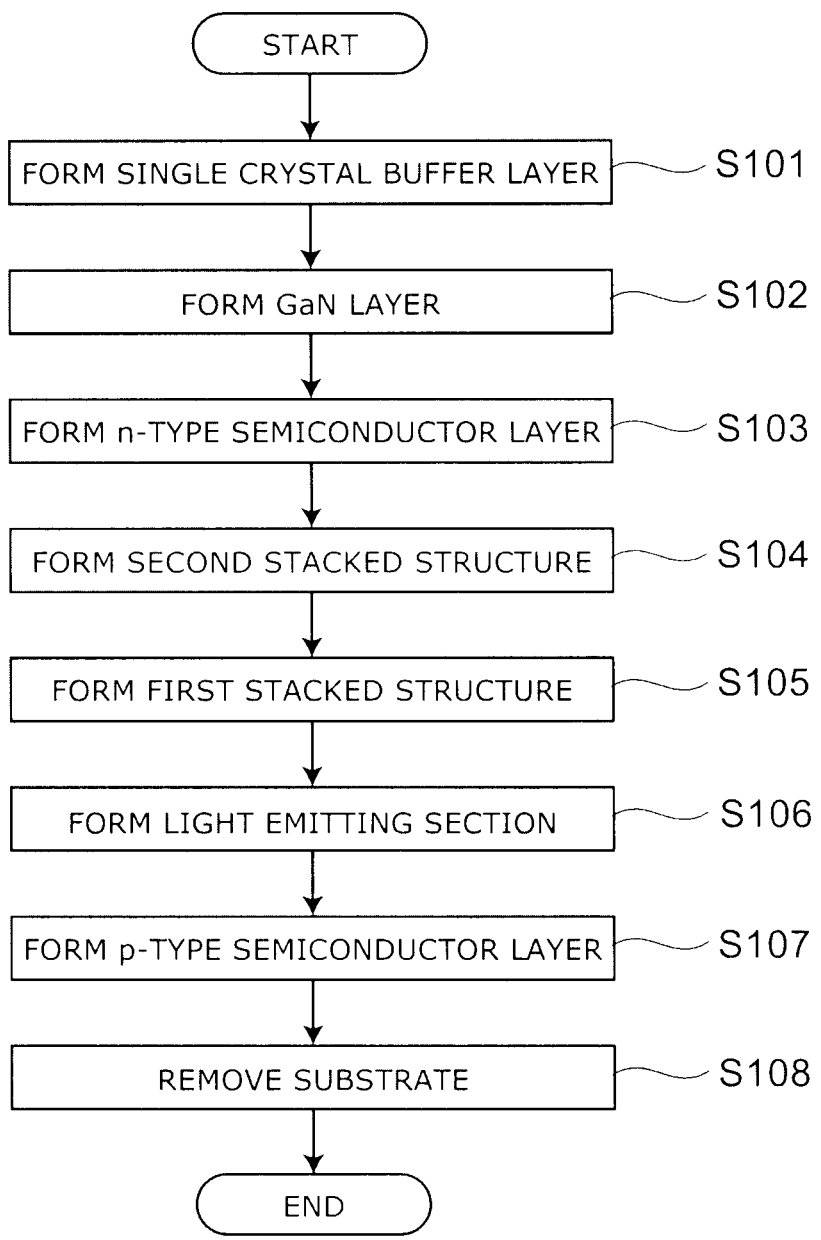
FIG. 11 is a flow chart illustrating a method for manufacturing a semiconductor light emitting device according to a third embodiment.

FIG. 11 is a flow chart illustrating a method for manufacturing a semiconductor light emitting device according to the third embodiment.

As shown in FIG. 11, in the method for manufacturing a semiconductor light emitting device according to the embodiment, a single crystal buffer layer including $Al_{x3}Ga_{1-x3}N$ ($0.8 \leq x3 \leq 1$) is formed on a substrate 110 (step S101). The substrate 110 has a major surface of the c-plane of a sapphire layer, or a major surface of silicon. For instance, a first AlN buffer layer 121a of high carbon concentration is formed. Then, on the first AlN buffer layer 121a, a second AlN buffer layer 121b of high purity is formed.

Then, on the single crystal buffer layer, a GaN layer is formed (step S102). For instance, a second buffer layer 122 and an n-type contact layer 130 are formed.

Then, on the GaN layer, an n-type semiconductor layer including a first layer 131 including at least one of n-type GaN and n-type AlGaN is formed (step S103).

On the n-type semiconductor layer, a second stacked structure 220 is formed (step S104). More specifically, a plurality of fifth layers 205 including a nitride semiconductor and a plurality of sixth layers 206 including GaInN are alternately stacked.

On the second stacked structure 220, a first stacked structure 210 is formed (step S105). More specifically, a plurality of third layers 203 including a nitride semiconductor and a plurality of fourth layers 204 including GaInN are alternately stacked. The third layer 203 has a composition different from the composition of the fifth layer 205.

On the first stacked structure 210, a light emitting unit 140 is formed (step S106). The light emitting unit 140 includes a plurality of barrier layers 41 and a well layer 42 provided between the plurality of barrier layers 41.

On the light emitting unit 140, a p-type semiconductor layer including a second layer 151 including p-type AlGaN is formed (step S107).

After forming the p-type semiconductor layer, the substrate 110 is removed (step S108).

The above formation of the light emitting unit 140 can include e.g. forming a first barrier layer BL1 including $Al_{x1}Ga_{1-x1-y1}In_{y1}N$ ($0<x1$, $0 \leq y1$, $x1+y1<1$), forming a well layer 42 including $Al_{x0}Ga_{1-x0-y0}In_{y0}N$ ($0 \leq x0$, $0<y0$, $x0+y0<1$, $y1<y0$, $y2<y0$) on the first barrier layer BL1, and forming a second barrier layer BL2 including $Al_{x2}Ga_{1-x2-y2}In_{y2}N$ ($0<x2$, $0 \leq y2$, $x2+y2<1$) on the well layer 42. The thickness of the well layer 42 is e.g. 2.5 nm or more and 9 nm or less. For instance, the well layer 42 emits near ultraviolet light. For instance, the peak wavelength of the well layer 42 is e.g. 380 nm or more and 400 nm or less.

As in the above examples, the characteristics and structure of the light emitting unit 140 are not limited to this wavelength region, but can be based on various values and structures.

This manufacturing method can effectively increase the light emission efficiency by combining the removal of the substrate 110 with the formation of the first stacked structure 210 and the second stacked structure 220.

Figure 12:
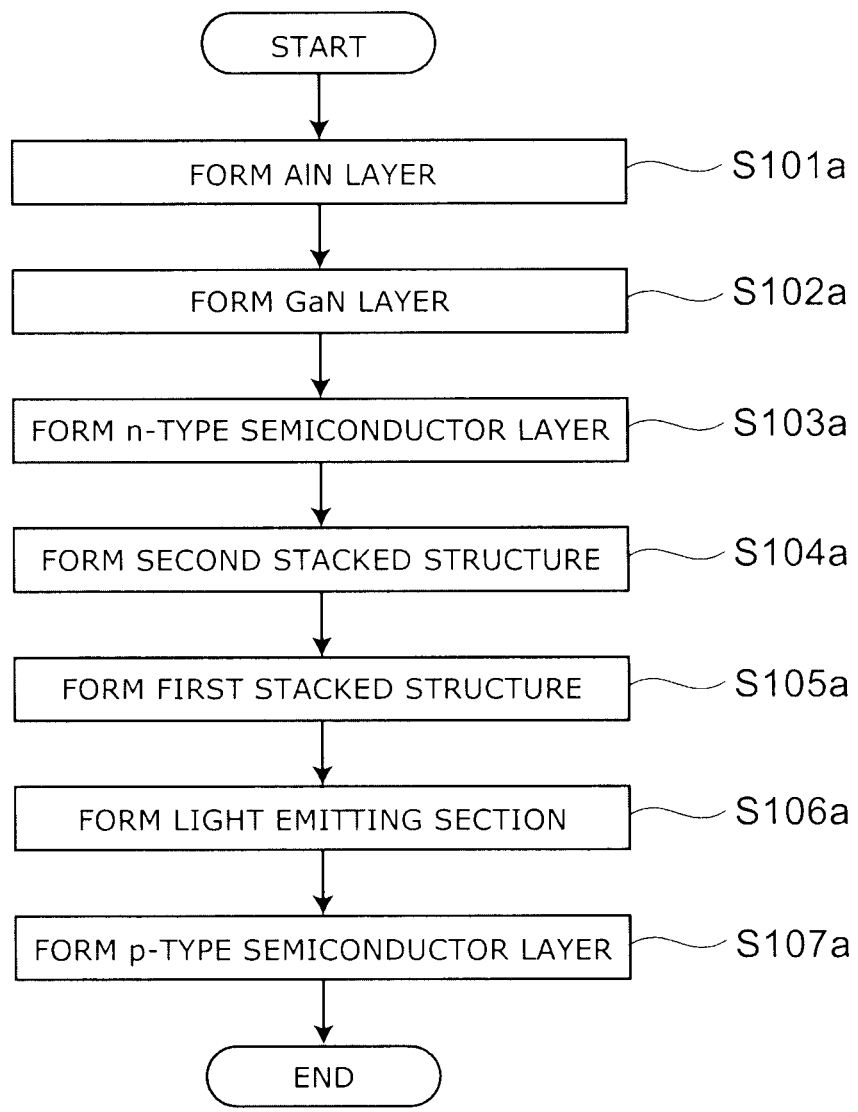
FIG. 12 is a flow chart illustrating an alternative method for manufacturing a semiconductor light emitting device according to the third embodiment.

FIG. 12 is a flow chart illustrating an alternative method for manufacturing a semiconductor light emitting device according to the third embodiment.

As shown in FIG. 12, in the alternative method for manufacturing a semiconductor light emitting device according to the embodiment, for instance, on a substrate 110 made of sapphire, an AlN layer (first buffer layer 121) is formed by the metal organic chemical vapor deposition method (step S101a).

Then, on this AlN layer, a GaN layer is formed by the metal organic chemical vapor deposition method (step S102a). For instance, a second buffer layer 122 and an n-type contact layer 130 are formed.

Then, on this GaN layer, an n-type semiconductor layer including a first layer 131 including at least one of n-type GaN and n-type AlGaN is formed by the metal organic chemical vapor deposition method (step S103a).

Then, on the n-type semiconductor layer, a second stacked structure 220 is formed by the metal organic chemical vapor deposition method (step S104a). More specifically, by the metal organic chemical vapor deposition method, a plurality of fifth layers 205 including a nitride semiconductor and a plurality of sixth layers 206 including GaInN are alternately stacked.

On the second stacked structure 220, a first stacked structure 210 is formed by the metal organic chemical vapor deposition method (step S105a). More specifically, by the metal organic chemical vapor deposition method, a plurality of third layers 203 including a nitride semiconductor and a plurality of fourth layers 204 including GaInN are alternately stacked. The third layer 203 has a composition different from the composition of the fifth layer 205.

On the first stacked structure 210, a light emitting unit 140 is formed by the metal organic chemical vapor deposition method (step S106a).

Then, on the light emitting unit 140, a p-type semiconductor layer including a second layer 151 including p-type AlGaN is formed by the metal organic chemical vapor deposition method (step S107a).

This manufacturing method can form a semiconductor layer with high crystal quality. Thus, a semiconductor light emitting device for emitting near ultraviolet light with particularly high efficiency can be manufactured with high productivity.

The above methods for manufacturing a semiconductor light emitting device are also applicable to a method for manufacturing a wafer.

That is, the method for manufacturing a wafer according to the embodiment can include the steps S101-S108 illustrated in FIG. 11, or steps S101a-S107a illustrated in FIG. 12. Thus, a wafer for emitting near ultraviolet light with particularly high efficiency can be manufactured with high productivity.

Fourth Embodiment

Figure 13:
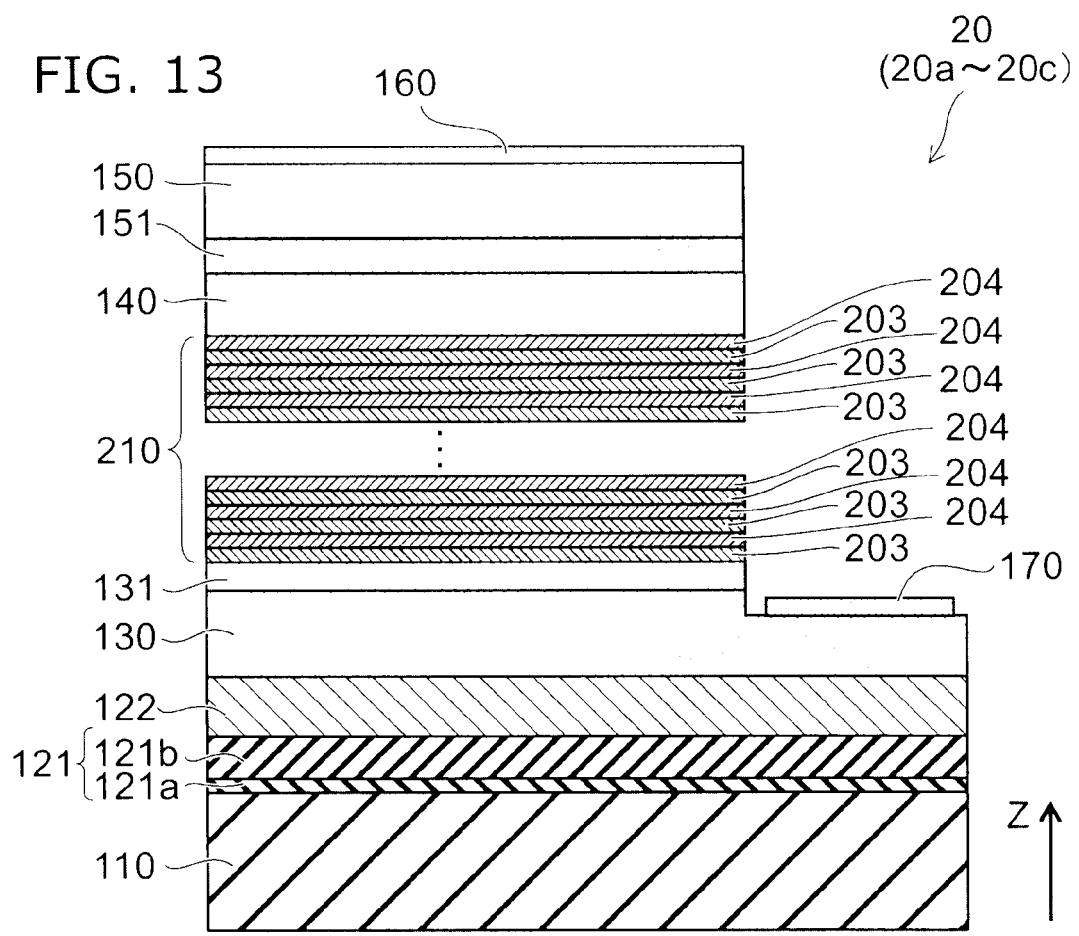
FIG. 13 is a schematic sectional view illustrating a semiconductor light emitting device according to a fourth embodiment.

FIG. 13 is a schematic sectional view illustrating the configuration of a semiconductor light emitting device according to a fourth embodiment.

As shown in FIG. 13, the semiconductor light emitting device 20 (and 20a-20c) according to the embodiment includes a first layer 131 of n-type including a nitride semiconductor, a second layer 151 of p-type including a nitride semiconductor, a light emitting unit 140, and a stacked structure 210s (first stacked structure 210).

Also in this case, the light emitting unit 140 is provided between the first layer 131 and the second layer 151.

As shown in FIGS. 2A to 2D, the light emitting unit 140 includes a plurality of barrier layers 41 and a well layer 42 provided between the plurality of barrier layers 41. The barrier layer 41 includes AlGaInN.

As shown in FIG. 13, the stacked structure 210s is provided between the first layer 131 and the light emitting unit 140. The stacked structure 210s includes a plurality of third layers 203 and a plurality of fourth layers 204 alternately stacked with the plurality of third layers 203. The third layer 203 includes AlGaInN. The thickness of each of the plurality of fourth layers 204 may be thinner than the thickness of the well layer 42. The fourth layer 204 includes GaInN.

The number of third layers 203 and the number of fourth layers 204 are 10 or more and 30 or less. That is, the number of pairs, m, of the third layer 203 and the fourth layer 204 is 10 or more and 30 or less.

The present inventors fabricated the semiconductor light emitting device while changing the number m, i.e., the number of third layers 203 and the number of fourth layers 204, and evaluated its characteristics.

Figure 14:
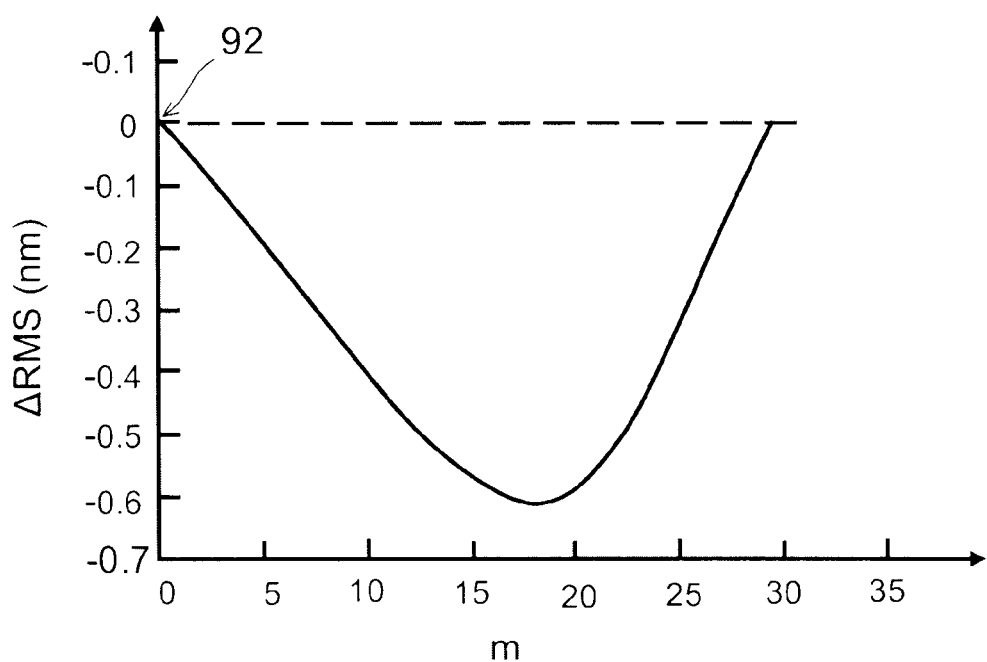
FIG. 14 is a graph illustrating the characteristics of the semiconductor light emitting devices according to the fourth embodiment.

FIG. 14 is a graph illustrating the characteristics of the semiconductor light emitting devices according to the fourth embodiment.

The horizontal axis represents the number of pairs m in the stacked structure 210s. The case of m=0 corresponds to a semiconductor light emitting device 92 (whose structure is not shown) of a reference example fabricated by the technique of not providing the stacked structure 210s. The vertical axis represents the surface flatness variation ΔRMS (nm) of the surface of the p-GaN layer (p-type contact layer 150). The surface flatness variation ΔRMS is the difference between the surface flatness of the p-type contact layer 150 in the semiconductor light emitting device provided with the stacked structure 210s and the surface flatness of the p-type contact layer 150 in the semiconductor light emitting device 92 of the reference example. Negativeness of ΔRMS means that the surface flatness of the p-type contact layer 150 is improved relative to the reference example. This indicates that the flatness of the light emitting unit 140 on the stacked structure 210s is improved relative to the case of not providing the stacked structure 210s. This means improvement in the characteristics, uniformity, and fabrication reproducibility of the semiconductor light emitting device.

As shown in FIG. 14, in the case where the number of pairs m was 0 (in the case of the semiconductor light emitting device 92 of the reference example without the stacked structure 210s), the surface flatness was low. On the other hand, in the case where the number of pairs m was as large as 30, the surface flatness was as low as that of the reference example. When the number of pairs m was 30 or less, the introduction of the stacked structure 210s can improve the flatness of the crystal surface, i.e., the characteristics of the semiconductor light emitting device. When the number of pairs m was 10 or more and 25 or less, the surface flatness was particularly good.

Here, a second stacked structure 220 with a plurality of GaN and GaInN layers alternately stacked therein was provided between the stacked structure 210s and the first layer 131. In this case, for the total number of pairs between 0 and 50, the flatness of the crystal surface was higher than that of the case without the stacked structure. That is, a larger effect was achieved in improving the crystal surface flatness and the characteristics of the semiconductor light emitting device due to the stacked structure.

Thus, in the case of alternately stacking a plurality of third layers 203 including AlGaInN and a plurality of fourth layers 204 including GaInN, the surface flatness is improved with the increase of the number of pairs m. However, it has turned out that if the number of pairs m exceeds a certain value (e.g., 25), the surface flatness is deteriorated.

Based on this phenomenon, in the semiconductor light emitting devices 20, 20a-20c according to the embodiment, the number of pairs m of the third layer 203 and the fourth layer 204 is set to 10 or more and 30 or less.

In the embodiment, the stacked structure 210s (first stacked structure 210) is used. Thus, the lattice mismatch between the third layer 203 and the fourth layer 204 is large. Hence, the effect of changing the direction of dislocations is large. Furthermore, even in the case where the crystal is not uniform in the plane, the effect of changing the direction of dislocations is large. This significantly contributes to increasing the efficiency of the semiconductor light emitting device.

Also in the embodiment, of the plurality of barrier layers 41, the barrier layer 41 nearest to the first stacked structure 210 is the first barrier layer BL1. The bandgap energy in the first barrier layer BL1 can be set larger than the bandgap energy in the other barrier layers 41 except the first barrier layer BL1 of the plurality of barrier layers 41 (second barrier layer BL2 to (n+1)-th barrier layer BL(n+1) (n is an integer of 1 or more)). In this configuration, the effect of increasing the efficiency by the first stacked structure 210 and the second stacked structure 220 is achieved more effectively.

Furthermore, also in the embodiment, the first barrier layer BL1 can include a first sublayer BL1a, a second sublayer BL1b, and a third sublayer BL1c described with reference to FIG. 7.

Figure 15:
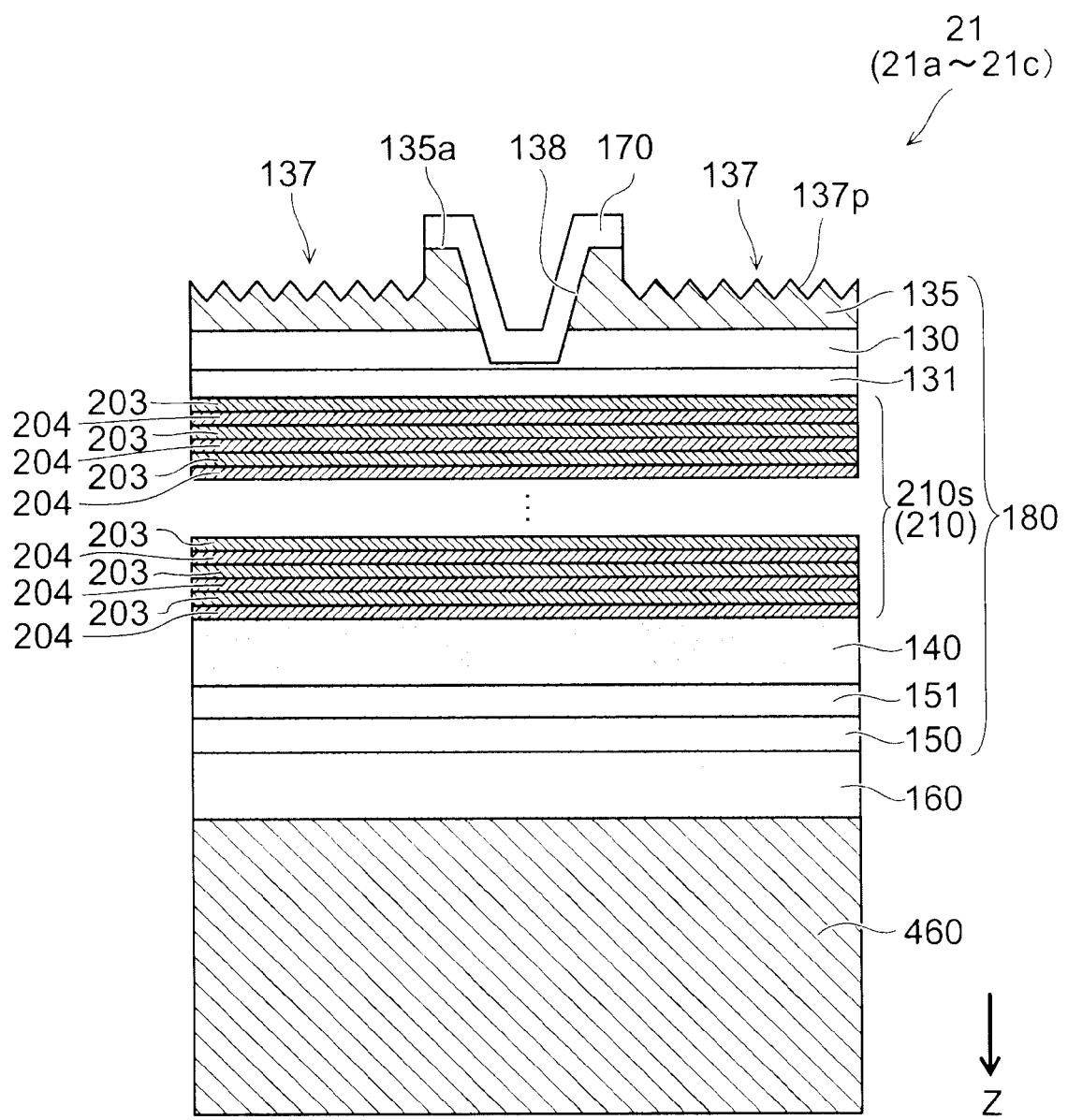
FIG. 15 is a schematic sectional view illustrating an alternative semiconductor light emitting device according to the fourth embodiment.

FIG. 15 is a schematic sectional view illustrating the configuration of an alternative semiconductor light emitting device according to the fourth embodiment.

As shown in FIG. 15, the alternative semiconductor light emitting device 21 (and semiconductor light emitting devices 21a-21c) according to the embodiment includes a conductive substrate 460, and a p-side electrode 160. The light emitting unit 140 in the semiconductor light emitting devices 21, 21a-21c can be configured as illustrated in FIGS. 2A to 2D.

Figure 16:
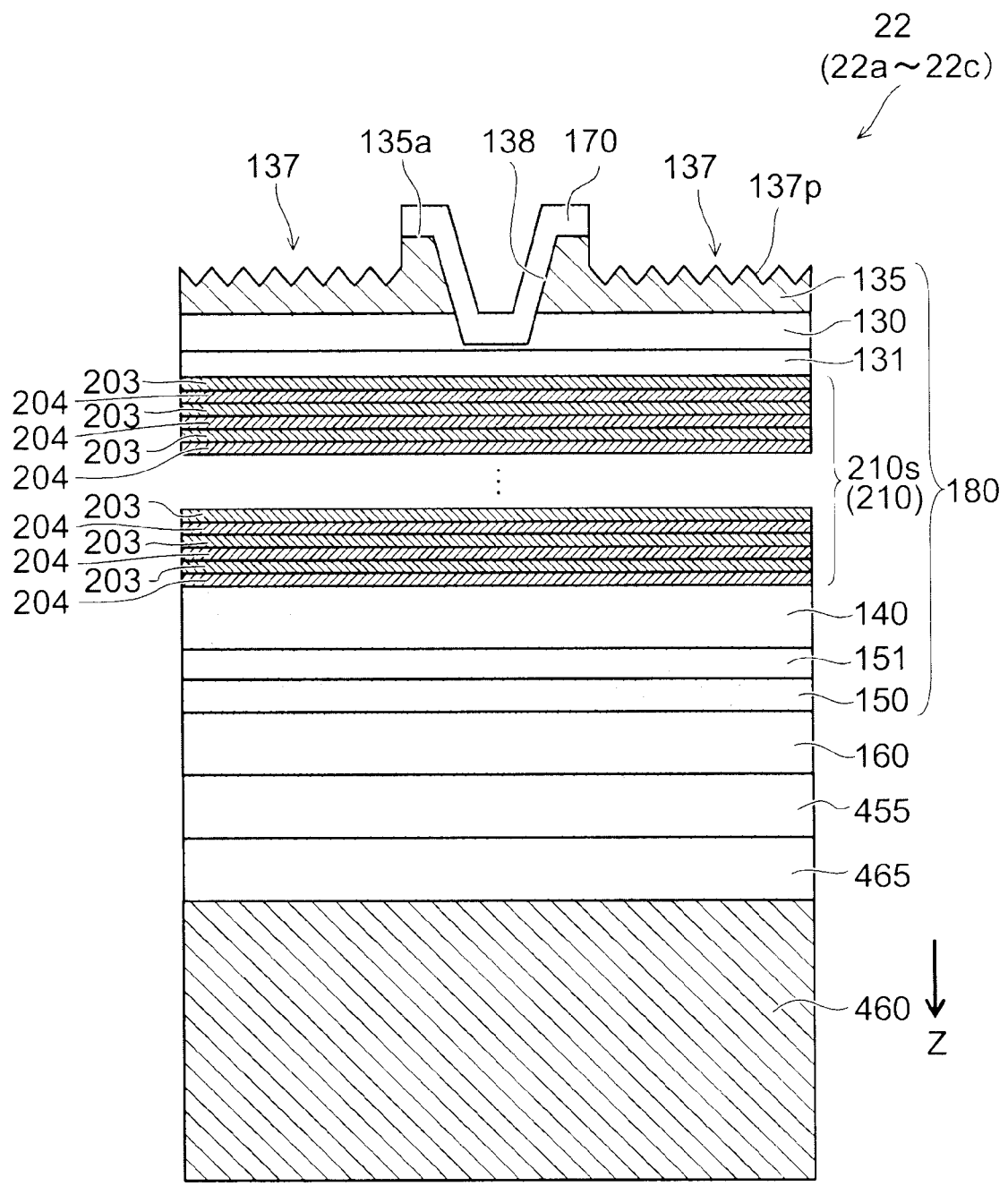
FIG. 16 is a schematic sectional view illustrating an alternative semiconductor light emitting device according to the fourth embodiment.

FIG. 16 is a schematic sectional view illustrating the configuration of an alternative semiconductor light emitting device according to the fourth embodiment.

As shown in FIG. 16, in the alternative semiconductor light emitting device 22 (and semiconductor light emitting devices 22a-22c) according to the embodiment, a first metal layer 455 is provided between a conductive substrate 460 and the p-side electrode 160. A second metal layer 465 is provided between the conductive substrate 460 and the first metal layer 455.

In the semiconductor light emitting device 21 (21a-21c) illustrated in FIG. 15 and the semiconductor light emitting device 22 (22a-22c) illustrated in FIG. 16, an n-type contact layer 130 is provided on the opposite side of the first layer 131 from the light emitting unit 140. A low impurity concentration semiconductor layer 135 (e.g., non-doped GaN layer) is provided on the opposite side of the n-type contact layer 130 from the first layer 131.

Also in this case, the low impurity concentration semiconductor layer 135 may be formed in a two-layer structure. More specifically, an n-type low impurity concentration layer (not shown) is provided between the second buffer layer 122 and the n-type contact layer 130. The second buffer layer 122 and this n-type low impurity concentration layer may be used as the low impurity concentration semiconductor layer 135.

Furthermore, also in this case, the low impurity concentration semiconductor layer 135 is provided with an opening 138. The n-side electrode 170 is provided so as to cover the n-type contact layer 130 exposed in the opening 138 and part of the low impurity concentration semiconductor layer 135. The major surface 135a of the low impurity concentration semiconductor layer 135 not covered with the n-side electrode 170 is provided with a rough surface portion 137 including an unevenness 137p.

Fifth Embodiment

Figure 17:
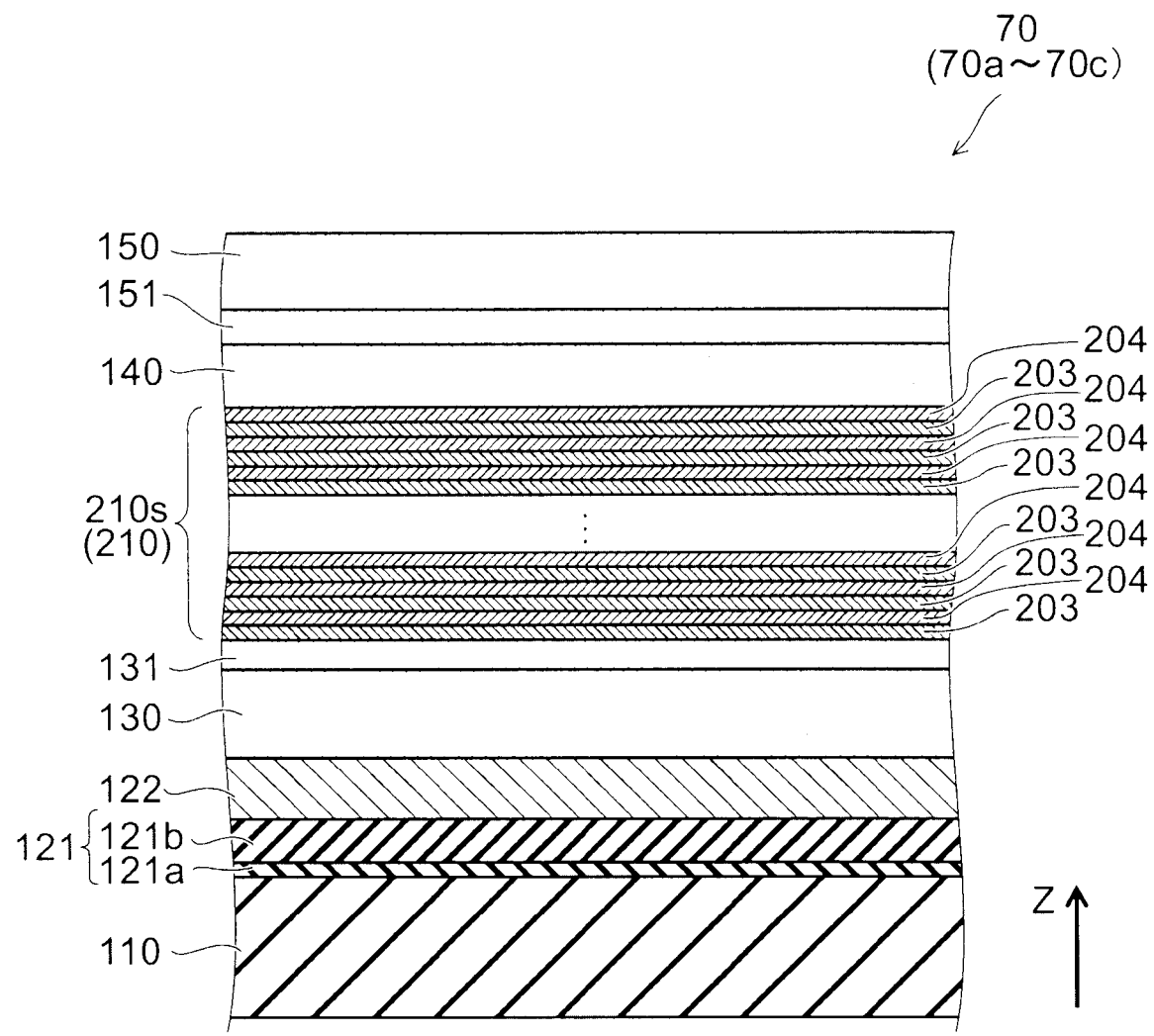
FIG. 17 is a schematic sectional view illustrating a wafer according to a fifth embodiment.

FIG. 17 is a schematic sectional view illustrating the configuration of a wafer according to a fifth embodiment.

As shown in FIG. 17, the wafer 70 (70a-70c) according to the embodiment includes a first layer 131 of n-type including a nitride semiconductor, a second layer 151 of p-type including a nitride semiconductor, a light emitting unit 140, and a stacked structure 210s (first stacked structure 210). The light emitting unit 140 is provided between the first layer 131 and the second layer 151. The light emitting unit includes a plurality of barrier layers 41 and a well layer 42 provided between the plurality of barrier layers 41. The light emitting unit 140 in the wafers 70, 70a, 70b, and 70c has a configuration illustrated in FIGS. 2A, 2B, 2C, and 2D, respectively.

The stacked structure 210s is provided between the first layer 131 and the light emitting unit 140. The stacked structure 210s includes a plurality of third layers 203 and a plurality of fourth layers 204 alternately stacked with the plurality of third layers 203. The plurality of third layers 203 include AlGaInN. The thickness of each of the plurality of fourth layers 204 is thinner than the thickness of the well layer 42. The fourth layer 204 includes GaInN.

The number of third layers 203 and the number of fourth layers 204 (the number of pairs) are 10 or more and 30 or less.

The wafer 70 (70a-70c) can have similar characteristics to those of the semiconductor light emitting device according to the fourth embodiment. That is, the wafer 70 (70a-70c) can provide a wafer having high efficiency.

As shown in FIG. 17, the wafer 70 (70a-70c) can further include various layers described with reference to the fourth embodiment.

The well layer 42 has a thickness of e.g. 2.5 nm or more and 9 nm or less. More preferably, the thickness of the well layer 42 is set to 5 nm or more and 7 nm or less. The well layer 42 emits near ultraviolet light. The peak wavelength of the well layer 42 is e.g. 380 nm or more and 400 nm or less.

In the embodiment, the wavelength region of the well layer 42 is not limited to this range. As described in the foregoing embodiments, the configuration of the embodiment is applicable to wide wavelength regions.

In the case of providing a plurality of well layers 42, particularly high efficiency is achieved.

The sum of the total thickness of the plurality of fourth layers 204 and the thickness of the well layer 42 can be set to 25 nm or more and 45 nm or less.

In the wafer 70 (70a-70c), the structure of the light emitting unit 140 (e.g., including the thickness of the barrier layer 41 and the well layer 42) can be based on various structures as in the embodiments described above.

Sixth Embodiment

The embodiment relates to a method for manufacturing e.g. the semiconductor light emitting device described with reference to the fourth embodiment.

Figure 18:
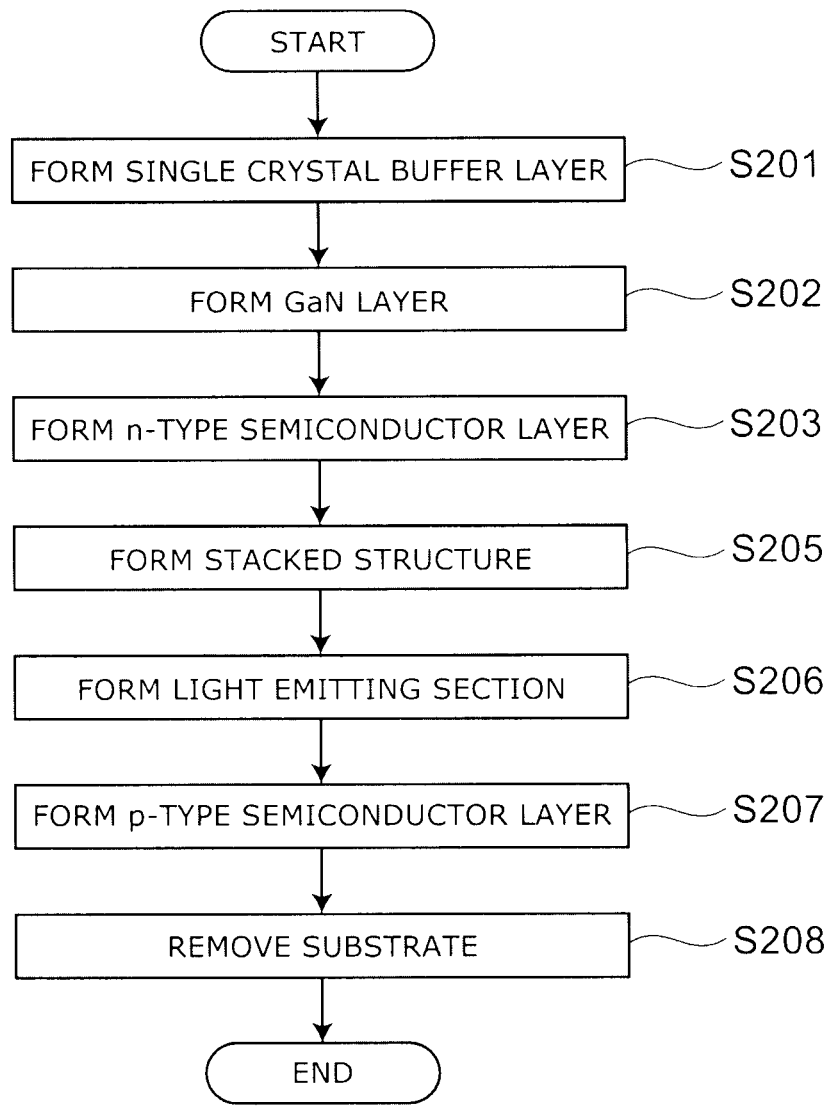
FIG. 18 is a flow chart illustrating a method for manufacturing a semiconductor light emitting device according to a sixth embodiment.

FIG. 18 is a flow chart illustrating a method for manufacturing a semiconductor light emitting device according to the sixth embodiment.

As shown in FIG. 18, in the method for manufacturing a semiconductor light emitting device according to the embodiment, a single crystal buffer layer including $Al_{x3}Ga_{1-x3}N$ ($0.8 \le x3 \le 1$) is formed on a substrate 110 (step S201). The substrate 110 has a major surface of the c-plane of a sapphire layer, or a major surface of silicon. For instance, a first AlN buffer layer 121a of high carbon concentration is formed. Then, on the first AlN buffer layer 121a, a second AlN buffer layer 121b of high purity is formed.

Then, on the single crystal buffer layer, a GaN layer is formed (step S202). For instance, a second buffer layer 122 and an n-type contact layer 130 are formed.

Then, on the GaN layer, an n-type semiconductor layer including a first layer 131 including at least one of n-type GaN and n-type AlGaN is formed (step S203).

On the n-type semiconductor layer, a stacked structure 210s is formed (step S205). More specifically, a plurality of third layers 203 including AlGaInN and a plurality of fourth layers 204 including GaInN are alternately stacked. The number of third layers 203 and fourth layers 204 (the number of pairs m) is 10 or more and 30 or less.

On the stacked structure 210s, a light emitting unit 140 is formed (step S206). The light emitting unit 140 includes a plurality of barrier layers 41 and a well layer 42 provided between the plurality of barrier layers 41. The well layer 42 has a thickness thinner than the thickness of the third layer 203.

On the light emitting unit 140, a p-type semiconductor layer including a second layer 151 including p-type AlGaN is formed (step S207).

After forming the p-type semiconductor layer, the substrate 110 is removed (step S208).

Figure 19:
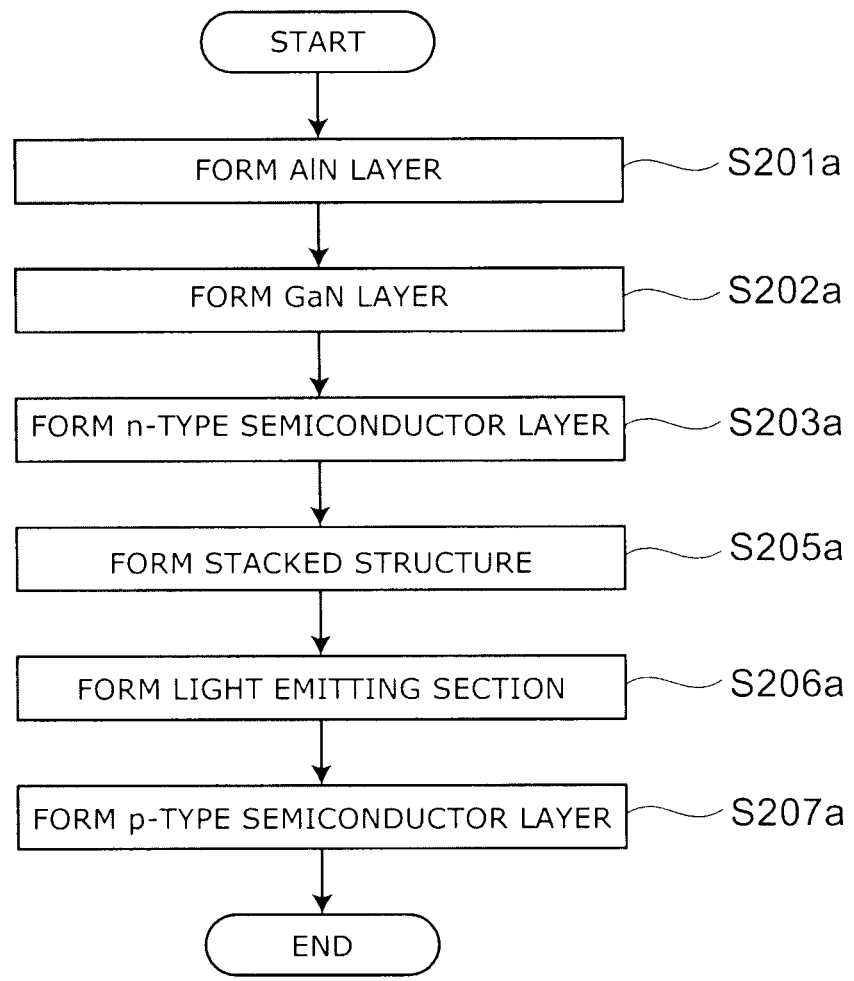
FIG. 19 is a flow chart illustrating an alternative method for manufacturing a semiconductor light emitting device according to the sixth embodiment.

FIG. 19 is a flow chart illustrating an alternative method for manufacturing a semiconductor light emitting device according to the sixth embodiment.

As shown in FIG. 19, in the alternative method for manufacturing a semiconductor light emitting device according to the embodiment, for instance, on a substrate 110 made of sapphire, an AlN layer (first buffer layer 121) is formed by the metal organic chemical vapor deposition method (step S201a).

Then, on this AlN layer, a GaN layer is formed by the metal organic chemical vapor deposition method (step S202a). For instance, a second buffer layer 122 and an n-type contact layer 130 are formed.

Then, on this GaN layer, an n-type semiconductor layer including a first layer 131 including at least one of n-type GaN and n-type AlGaN is formed by the metal organic chemical vapor deposition method (step S203a).

Then, on the n-type semiconductor layer, a stacked structure 210s is formed by the metal organic chemical vapor deposition method (step S205a). More specifically, a plurality of third layers 203 including AlGaInN and a plurality of fourth layers 204 including GaInN are alternately stacked. The number of third layers 203 and fourth layers 204 (the number of pairs m) is 10 or more and 30 or less.

On the stacked structure 210s, a light emitting unit 140 is formed by the metal organic chemical vapor deposition method (step S206a).

Then, on the light emitting unit 140, a p-type semiconductor layer including a second layer 151 including p-type AlGaN is formed by the metal organic chemical vapor deposition method (step S207a).

This manufacturing method can form a semiconductor layer with high crystal quality. Thus, a semiconductor light emitting device for emitting near ultraviolet light with particularly high efficiency can be manufactured with high productivity.

The above methods for manufacturing a semiconductor light emitting device are also applicable to a method for manufacturing a wafer.

That is, the method for manufacturing a wafer according to the embodiment can include the steps S201-S208 illustrated in FIG. 18, or steps S201a-S207a illustrated in FIG. 19. Thus, a wafer for emitting near ultraviolet light with particularly high efficiency can be manufactured with high productivity.

The embodiments can provide a semiconductor light emitting device, a wafer, a method for manufacturing a semiconductor light emitting device, and a method for manufacturing a wafer having high efficiency.

In the description, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the concentrations x, y, and z varied in the respective ranges. Furthermore, the "nitride semiconductor" also includes those of the above chemical formula further containing group V elements other than N (nitrogen), those further containing various elements added for controlling various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiments of the invention have been described above with reference to examples. However, the embodiments of the invention are not limited to these examples. For instance, any specific configurations of various components such as the semiconductor layer, light emitting unit, well layer, barrier layer, stacked structure, electrode, substrate, and buffer layer included in the semiconductor light emitting device are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the semiconductor light emitting device, the wafer, the method for manufacturing a semiconductor light emitting device, and the method for manufacturing a wafer described above in the embodiments of the invention. All the semiconductor light emitting devices, the wafers, the methods for manufacturing a semiconductor light emitting device, and the methods for manufacturing a wafer thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a first layer of n-type including a nitride semiconductor;
   a second layer of p-type including a nitride semiconductor;
   a light emitting unit provided between the first layer and the second layer and including a plurality of barrier layers and a well layer provided between the barrier layers;
   a first stacked structure provided between the first layer and the light emitting unit, the first stacked structure including:
      a plurality of third layers including AlGaInN; and
      a plurality of fourth layers alternately stacked with the third layers, each of the fourth layers having a thickness thinner than a thickness of the well layer, and including GaInN; and
   a second stacked structure provided between the first layer and the first stacked structure, the second stacked structure including:
      a plurality of fifth layers including GaN; and
      a plurality of sixth layers alternately stacked with the fifth layers, each of the sixth layers having a thickness thinner than the thickness of the well layer, and including GaInN;
   wherein a Si concentration in a first barrier layer of the barrier layers nearest to the first stacked structure is higher than a Si concentration in the first stacked structure,
   a Si concentration in the second stacked structure is lower than the Si concentration in the first stacked structure,
   a Si concentration in the first layer is lower than the Si concentration in the second stacked structure,
   a Si concentration in other barrier layers except the first barrier layer is lower than the Si concentration in the first barrier layer, and
   the Si concentration in the first barrier layer is $1.2 \times 10^{19}$ cm$^{-3}$ or more and $1.5 \times 10^{19}$ cm$^{-3}$ or less.

2. The device according to claim 1, wherein
   a thickness of each of the third layers is thinner than a thickness of one of the barrier layers, and a thickness of each of the fifth layers is thinner than the thickness of one of the barrier layers.

3. The device according to claim 1, wherein a bandgap energy in the first barrier layer is larger than a bandgap energy in other barrier layers except the first barrier layer.

4. The device according to claim 1, wherein a corresponding emission wavelength of the first stacked structure is 370 nanometers or more and 380 nanometers or less.

5. The device according to claim 1, wherein sum of a total thickness of the fourth layers and the thickness of the well layer is 25 nanometers or more and 45 nanometers or less.

6. A wafer comprising:
a first layer of n-type including a nitride semiconductor;
a second layer of p-type including a nitride semiconductor;
a light emitting unit provided between the first layer and the second layer, the light emitting unit including a plurality of barrier layers and a well layer provided between the barrier layers;
a first stacked structure provided between the first layer and the light emitting unit, the first stacked structure including:
a plurality of third layers including AlGaInN; and
a plurality of fourth layers alternately stacked with the third layers, each of the fourth layers having a thickness thinner than a thickness of the well layer, and including GaInN; and
a second stacked structure provided between the first layer and the first stacked structure, the second stacked structure including:
a plurality of fifth including GaN; and
a plurality of sixth layers alternately stacked with the fifth layers, each of the sixth layers having a thickness thinner than the thickness of the well layer, and including GaInN;
wherein a Si concentration in a first barrier layer of the barrier layers nearest to the first stacked structure is higher than a Si concentration in the first stacked structure,
a Si concentration in the second stacked structure is lower than the Si concentration in the first stacked structure,
a Si concentration in the first layer is lower than the Si concentration in the second stacked structure,
a Si concentration in other barrier layers except the first barrier layer is lower than the Si concentration in the first barrier layer, and
the Si concentration in the first barrier layer is $1.2 \times 10^{19}$ cm$^{-3}$ or more and $1.5 \times 10^{19}$ cm$^{-3}$ or less.

7. The wafer according to claim 6, wherein
a thickness of each of the third layers is thinner than a thickness of one of the barrier layers, and
a thickness of each of the fifth layers is thinner than the thickness of one of the barrier layers.

8. The device according to claim 1, wherein a number of the third layers and a number of the fourth layers is 10 or more and 30 or less.

9. The device according to claim 1, wherein the barrier layers include AlGaInN.

10. The wafer according to claim 6, wherein a number of the third layers and a number of the fourth layers is 10 or more and 30 or less.

11. The wafer according to claim 6, wherein
the barrier layers include AlGaInN.

12. The device according to claim 8, wherein a bandgap energy in a first barrier layer of the barrier layers nearest to the first stacked structure is larger than a bandgap energy in other barrier layers except the first barrier layer of the barrier layers.

13. The device according to claim 8, wherein a corresponding emission wavelength of the first stacked structure is 370 nanometers or more and 380 nanometers or less.

14. The device according to claim 8, wherein sum of a total thickness of the fourth layers and the thickness of the well layer is 25 nanometers or more and 45 nanometers or less.

* * * * *